(12) United States Patent
Yang et al.

(10) Patent No.: US 12,266,593 B2
(45) Date of Patent: Apr. 1, 2025

(54) METHOD OF FORMING SEMICONDUCTOR DEVICE HAVING AT LEAST ONE VIA INCLUDING CONCAVE PORTIONS ON SIDEWALL

(71) Applicant: Taiwan Semiconductor Manufacturing Company, Ltd., Hsinchu (TW)

(72) Inventors: Ting-Li Yang, Tainan (TW); Wen-Hsiung Lu, Tainan (TW); Jhao-Yi Wang, Tainan (TW); Fu Wei Liu, Hsincu (TW); Chin-Yu Ku, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/363,733

(22) Filed: Aug. 2, 2023

(65) Prior Publication Data

US 2023/0395468 A1 Dec. 7, 2023

Related U.S. Application Data

(62) Division of application No. 17/461,972, filed on Aug. 30, 2021, now Pat. No. 11,942,398.

(51) Int. Cl.
*H01L 21/48* (2006.01)
*H01L 21/768* (2006.01)
*H01L 23/48* (2006.01)

(52) U.S. Cl.
CPC .......... *H01L 23/481* (2013.01); *H01L 21/486* (2013.01); *H01L 21/76879* (2013.01)

(58) Field of Classification Search
CPC .................... H01L 21/486; H01L 21/76879
USPC .......................................................... 257/734
See application file for complete search history.

(56) References Cited

U.S. PATENT DOCUMENTS

| | | | |
|---|---|---|---|
| 2007/0224775 A1* | 9/2007 | Lindert | H01L 21/76232 257/E21.549 |
| 2013/0320538 A1* | 12/2013 | Jindal | H01L 21/76898 257/E21.586 |
| 2014/0312468 A1* | 10/2014 | Chen | H01L 21/30655 257/621 |
| 2021/0057370 A1* | 2/2021 | Komposch | H01L 21/76898 |

FOREIGN PATENT DOCUMENTS

CN 12563328 A * 3/2021 ..... H01L 21/823475

* cited by examiner

*Primary Examiner* — Phuc T Dang
(74) *Attorney, Agent, or Firm* — JCIPRNET

(57) ABSTRACT

A semiconductor device includes a substrate, at least one via, a liner layer and a conductive layer. The substrate includes an electronic circuitry. The at least one via passes through the substrate. The at least one via includes a plurality of concave portions on a sidewall thereof. The liner layer fills in the plurality of concave portions of the at least one via. The conductive layer is disposed on the sidewall of the at least one via, covers the liner layer, and extends onto a surface of the substrate. The thickness of the conductive layer on the sidewall of the at least one via is varied.

20 Claims, 27 Drawing Sheets

METHOD OF FORMING SEMICONDUCTOR DEVICE HAVING AT LEAST ONE VIA INCLUDING CONCAVE PORTIONS ON SIDEWALL

CROSS-REFERENCE TO RELATED APPLICATION

This application is a divisional application of and claims the priority benefit of a prior application Ser. No. 17/461,972, filed on Aug. 30, 2021. The entirety of the above-mentioned patent application is hereby incorporated by reference herein and made a part of this specification.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, developments in IC processing and manufacturing are researched.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
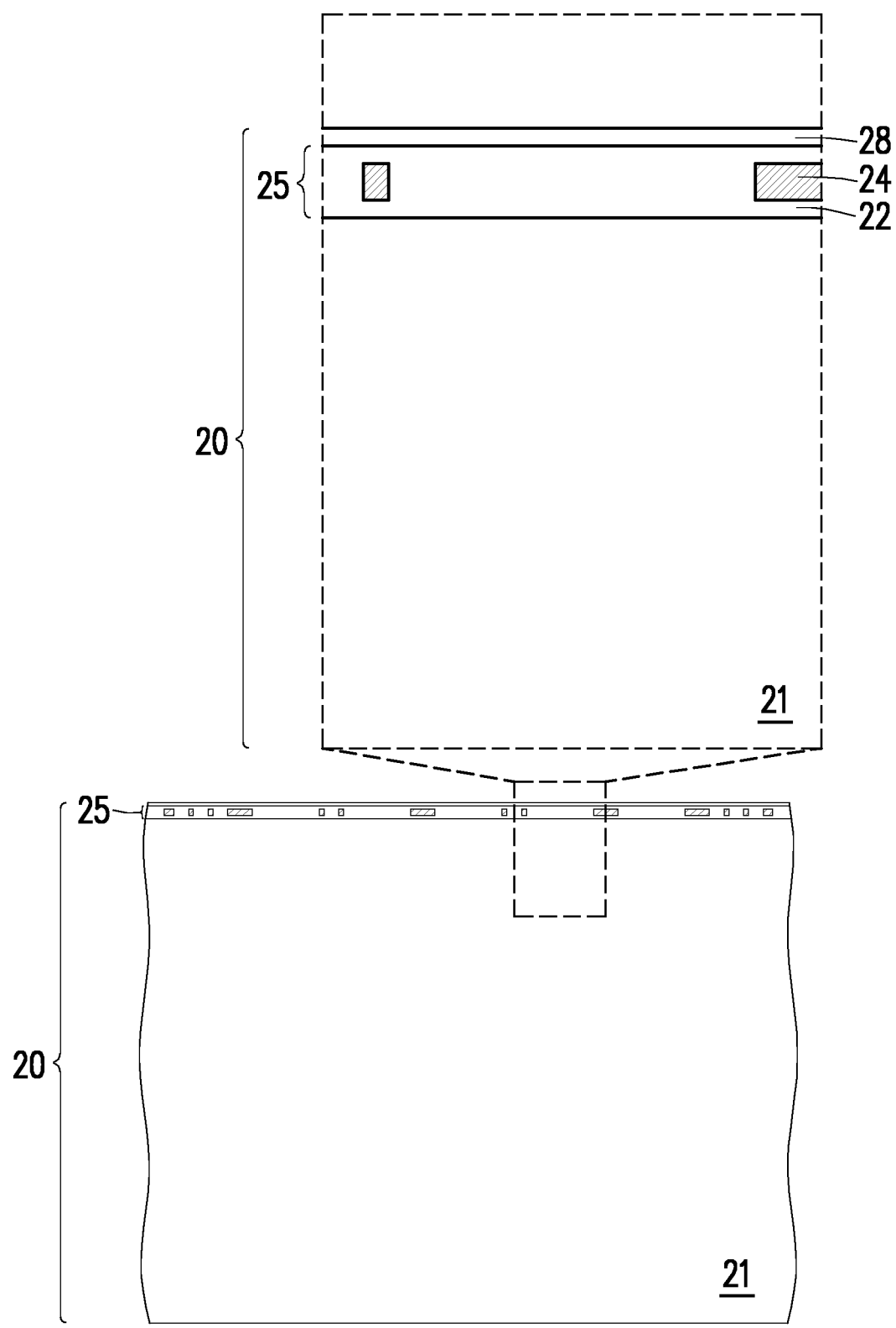
FIG. 1A to FIG. 1J are schematic cross-sectional views of a method of manufacturing a semiconductor device according to some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The semiconductor device of the disclosure provides a thicker metal protection layer in a high-aspect-ratio (e.g., AR≥6) via or a trench with a scallop-like sidewall. In some embodiments, the semiconductor device of the disclosure is an optical element used in a photolithography patterning process. In some embodiments, the semiconductor device of the disclosure is a mask for forming patterns of a reticle or patterns of a die. In some embodiments, the semiconductor device of the disclosure can be a beam controller, such as a light beam deflector, an electron beam deflector, an electromagnetic beam deflector or the like. In some embodiments, the semiconductor device of the disclosure serves as a beam deflector by which one or more electrons or light beams are deflected by an operation of an electronic circuit embedded in the semiconductor device.

FIG. 1A to FIG. 1J are schematic cross-sectional views of a method of manufacturing a semiconductor device according to some embodiments of the present disclosure. It is understood that the disclosure is not limited by the method described below. Additional operations can be provided before, during, and/or after the method and some of the operations described below can be replaced or eliminated, for additional embodiments of the methods. The order of the operations/processes may be interchangeable.

Referring to FIG. 1A, a circuit substrate 20 is provided. In some embodiments, the circuit substrate 20 has a device layer 25 formed in a front surface region thereof. Specifically, the circuit substrate 20 includes a semiconductor substrate 21 and a device layer 25 formed on the front surface or active side of the semiconductor substrate 21. In some embodiments, the circuit substrate 20 is provided as a wafer-type substrate at this stage. The circuit substrate 20 is referred to as a "circuit wafer", "device wafer", "device substrate" or "substrate" in some examples. The circuit substrate 20 may include multiple semiconductor device regions that are singulated in the subsequent operation to form separate semiconductor devices.

The semiconductor substrate 21 includes an elementary semiconductor such as silicon, germanium and/or a compound semiconductor such as silicon germanium, silicon carbide, gallium arsenic, indium arsenide, gallium nitride or indium phosphide. For example, the semiconductor substrate 21 is a silicon-on-insulator (SOI) substrate or a silicon substrate. In various embodiments, the semiconductor substrate 21 may take the form of a planar substrate, a substrate with multiple fins, nanowires, or other forms known to people having ordinary skill in the art.

The device layer 25 includes at least one transistor, such as a complementary metal-oxide-semiconductor (CMOS) transistor, a fin field effect transistor (FinFET), a gate all around FET (GAA-FET) or the like. The device layer 25 further includes metallization layers over the semiconductor substrate 21 and covering the transistor. The metallization layers may include conductive features 24 embedded in dielectric layers 22, so as to electrically connect different devices in and/or on the semiconductor substrate 21 to form a functional circuit. The device layer 25 is referred to as an "electronic circuitry" in some examples. The metallization layers may be formed through any suitable process (such as deposition, plating, damascene, dual damascene, or the like). The dielectric layers 22 include an inter-layer dielectric (ILD) layer and one or more inter-metal dielectric (IMD) layers. The conductive features 24 may include multiple layers of conductive lines and conductive plugs. The conductive plugs include contact plugs and via plugs. The contact plugs are located in the ILD layer to connect the metal lines to the device. The via plugs are located in the IMD layers to connect the metal lines in different layers. The dielectric layers 22 include silicon oxide, silicon nitride, silicon oxynitride, a low-k dielectric material, or a combination thereof. The conductive features 24 include a metal, a metal alloy or a combination thereof, such as tungsten (W), copper (Cu), copper alloy, aluminum (Al), aluminum alloy, or a combination thereof.

After the device layer 25 is formed, at least one passivation layer 28 is formed over the front surface of the circuit substrate 20. In some embodiments, the at least one passivation layer 28 includes silicon oxide, silicon nitride, or an organic film. In some embodiments, the at least one passivation layer 28 includes a polymer material such as polybenzoxazole (PBO), polyimide (PI), benzocyclobutene (BCB), the like, or a combination thereof. The passivation layer 28 is regarded as part of the circuit substrate in some examples.

Figure 1B:
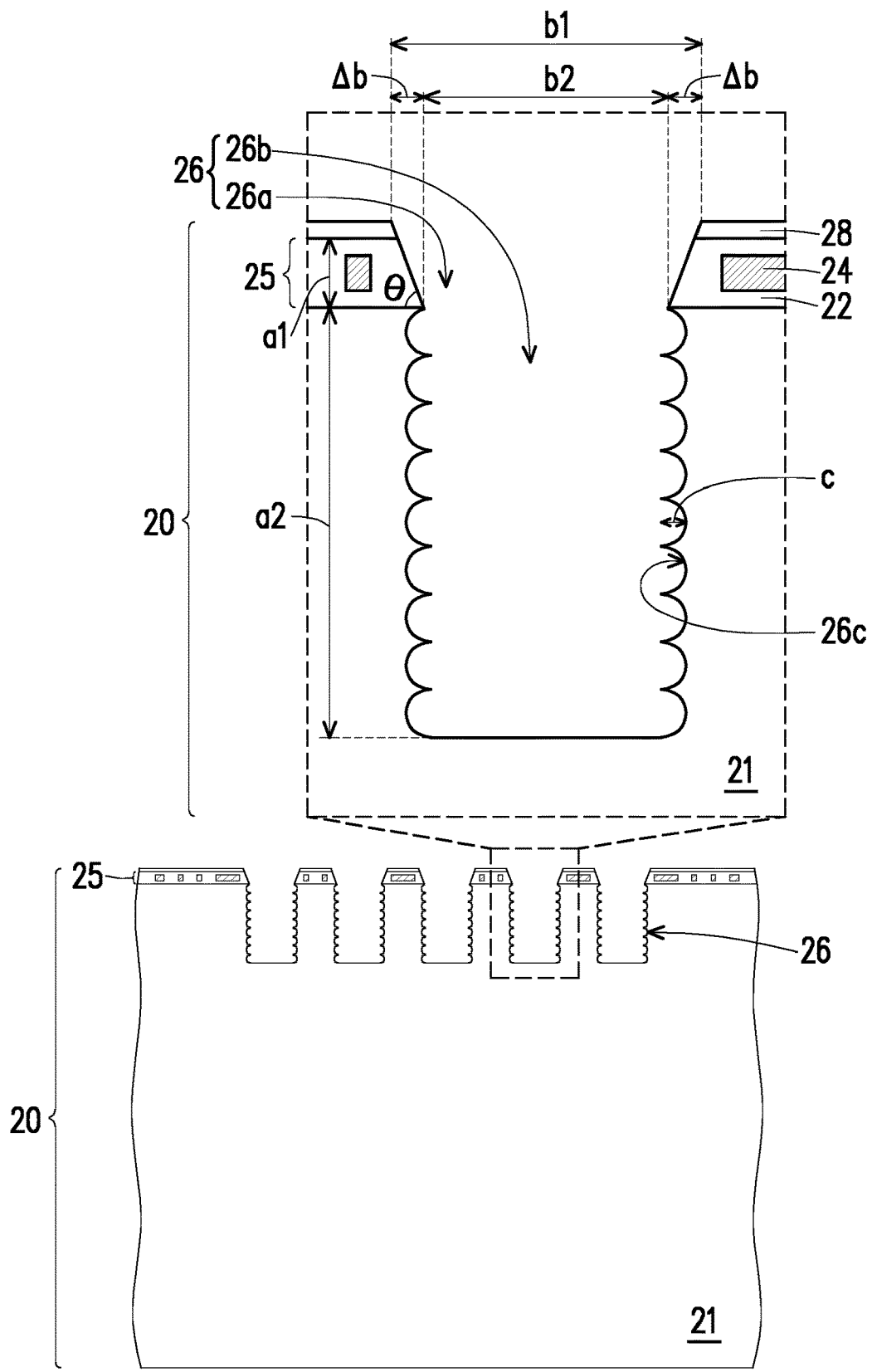

Referring to FIG. 1B, one or more vias 26 are formed in the circuit substrate 20. The vias 26 are formed such that no metallic pattern is exposed within the vias in some embodiments. In some embodiments, a mask layer is formed on the passivation layer 28, and an etching process is performed by using the mask layer as a mask. In some embodiments, vias 26 are formed through the passivation layer 28 and the device layer and extend into the semiconductor substrate 21. The etching process includes a dry etching, a wet etching, a reactive-ion etching such as a Bosch etching. The etching process may be such that the vias 26 are etched from the front surface to reach approximately from tens of micron to hundreds of micron in depth without passing through the back surface.

In some embodiments, the etching process may result in a substantially smooth sidewall of the upper opening 26a of each via 26 adjacent to the device layer 25, and a series of etched macro-scallops or concave portions 26c on the sidewall of the lower opening 26b of each via 26 adjacent to the semiconductor substrate 21. From another point of view, each of the vias 26 includes an upper opening 26a, a lower opening 26b below the upper opening 26a, and concave portions 26c on the sidewall of the lower opening 26b. The upper opening 26a, the lower opening 26b and the concave portions 26c are in spatial communication with each other. The concave portions 26c are regarded as part of the lower opening 26b in some examples.

Each of the vias 26 has a high aspect ratio of about 6 or more, such as about 10 or more. In some embodiments, the upper opening 26a has a depth a1 ranging from about 2 um to 40 um, and the lower opening 26b has a depth a2 ranging from about 10 um to 200 um. In some embodiments, the upper opening 26a has a width b1 ranging from about 3 um to 110 um, the lower opening 26b has a width b2 ranging from about 3 um to 100 um, and the difference Δb between them is greater than zero, such as from about 0.1 um to 10 um (e.g., 0.1 um to 5 um). In some embodiments, the concave portions 26c are arranged along the sidewall of the lower opening 26b and have a width c ranging from about 0.01 um to 0.2 um. In some embodiments, a series of etched macro-scallops or concave portions 26c may be created merely on the exposed sidewall of the semiconductor substrate 21. In some embodiments, the concave portions 26c have substantially the same size or width, as shown in FIG. 1B. However, the disclosure is not limited thereto. In other embodiments, the concave portions 26c can vary in size or width depending on process parameters. In some embodiments, the included angle θ between the sidewall of the upper opening 26a and the bottom surface of the device layer is less than about 90 degrees, such as from about 30 to 89.5 degrees. However, the disclosure is not limited thereto. In some cases, the included angle θ between the sidewall of the upper opening 26a and the bottom surface of the device layer 25 is about 90 degrees, and difference Δb between the width b1 and the width b2 is about zero.

Such scallop-like sidewall can be described as a ripped, rough, stair-step or wavy sidewall in some examples. In some embodiments, the macro-scallops or concave portions 26c are formed continuously along the sidewall of the lower opening 26b, as shown in FIG. 1B. In other embodiments, the macro-scallops or concave portions 26c are formed discontinuously along the sidewall of the lower opening 26b; that is, the adjacent concave portions 26c are separated from each other.

Figure 1C:
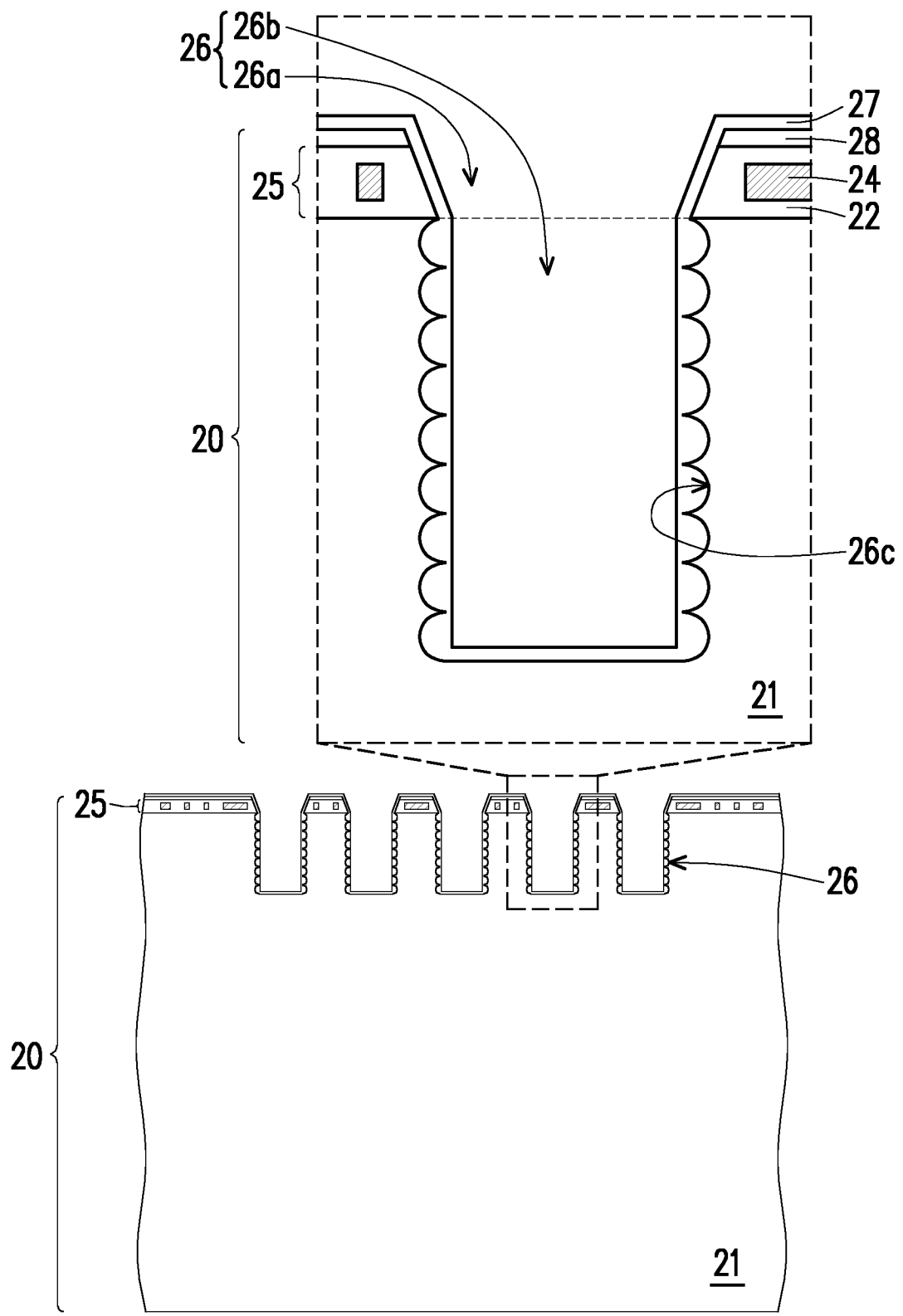

Referring to FIG. 1C, a liner layer 27 is formed over the circuit substrate 20 along the sidewalls and bottoms of the vias 26 and fills in the wall scallops or concave portions 26c of the vias 26. Specifically, the liner layer 27 is formed on the surface of the passivation layer 28, on the smooth sidewalls of the upper openings 26b, and on the scallop-like sidewalls and bottoms of the lower openings 26b.

In some embodiments, the liner layer 27 includes an insulating material, such as silicon oxide, silicon nitride, silicon oxynitride or the like, and may be formed by a suitable deposition process, such as a chemical vapor deposition (CVD) process, a physical vapor deposition (PVD) process, an atomic layer deposition (ALD) process, or the like. In certain embodiments, a CVD method is used to form the liner layer 27. The liner layer 27 is referred to as an "insulating liner" in some examples. In some embodiments, the wall scallops are completely filled by the liner layer 27, creating a flat surface for the following metal film deposition. Specifically, the liner layer 27 has a scallop-like sidewall facing the semiconductor substrate 21 and a substantially smooth sidewall facing the subsequently formed conductive layer.

Figure 1D:
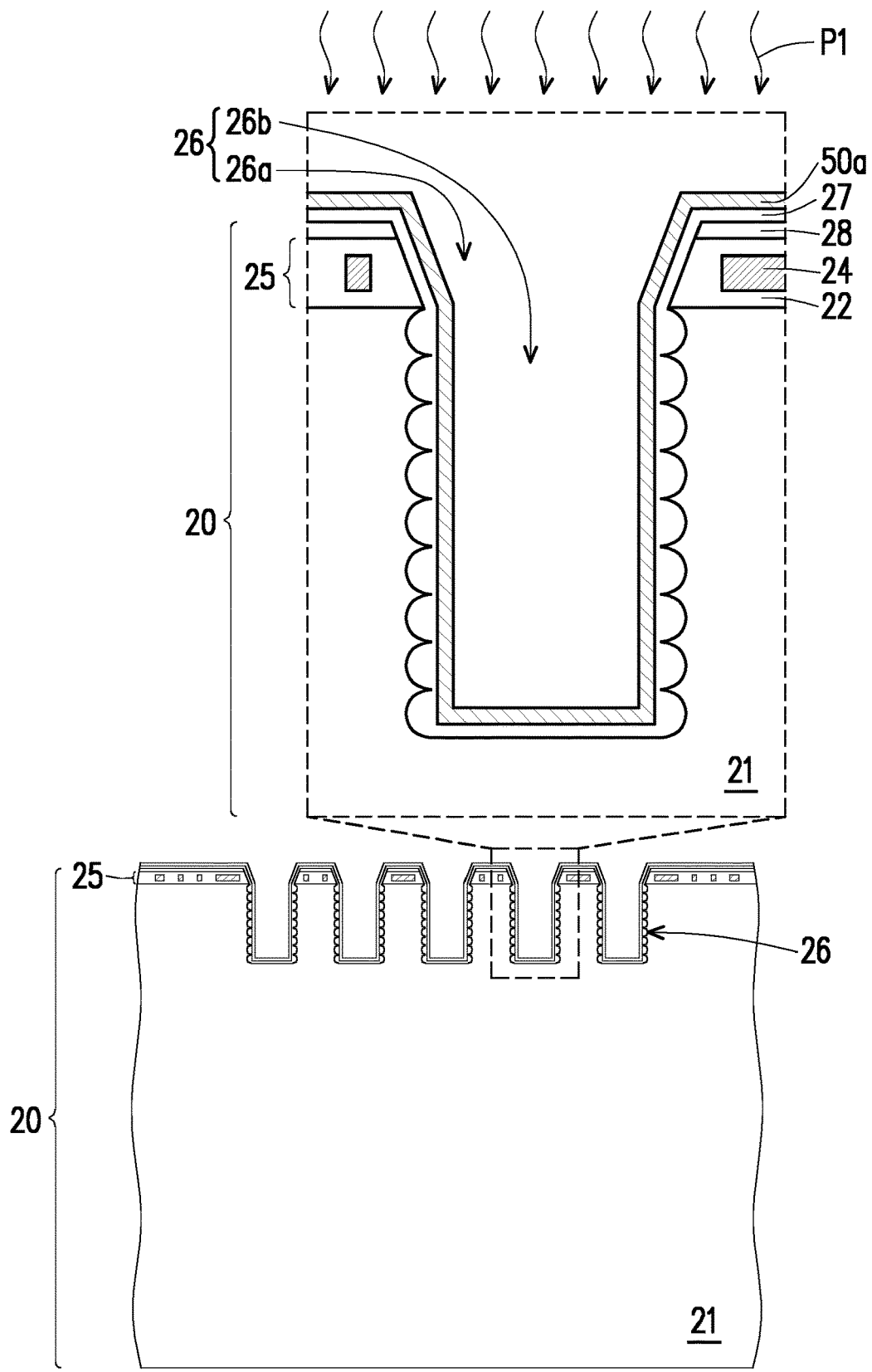

Referring to FIG. 1D, a conductive layer 50a is formed on the circuit substrate 20 along the sidewalls and bottoms of the vias 26. In some embodiments, the conductive layer 50a is conformally formed inside the vias 26 such that the inner sidewall and the bottom of each via 26 are fully covered by the conductive layer 50a. In some embodiments, a deposition process P1 is performed to form a conductive layer 50a on the circuit substrate 20 and covers the liner layer 27. The conductive layer 50a may include one or more layers of Au, Ti, Cu, Ag and Ni or an alloy thereof. In some embodiments, the deposition process P1 includes a chemical vapor deposition (CVD) process, a physical vapor deposition (PVD) process including a sputtering, an atomic layer deposition (ALD) process, a plating or any other suitable film deposition method. In certain embodiments, a sputtering method is used to form the conductive layer 50a. In some embodiments, the conducive layer 50a has a substantially equal thickness ranging from about 0.05 um to 0.2 um.

Figure 1E:
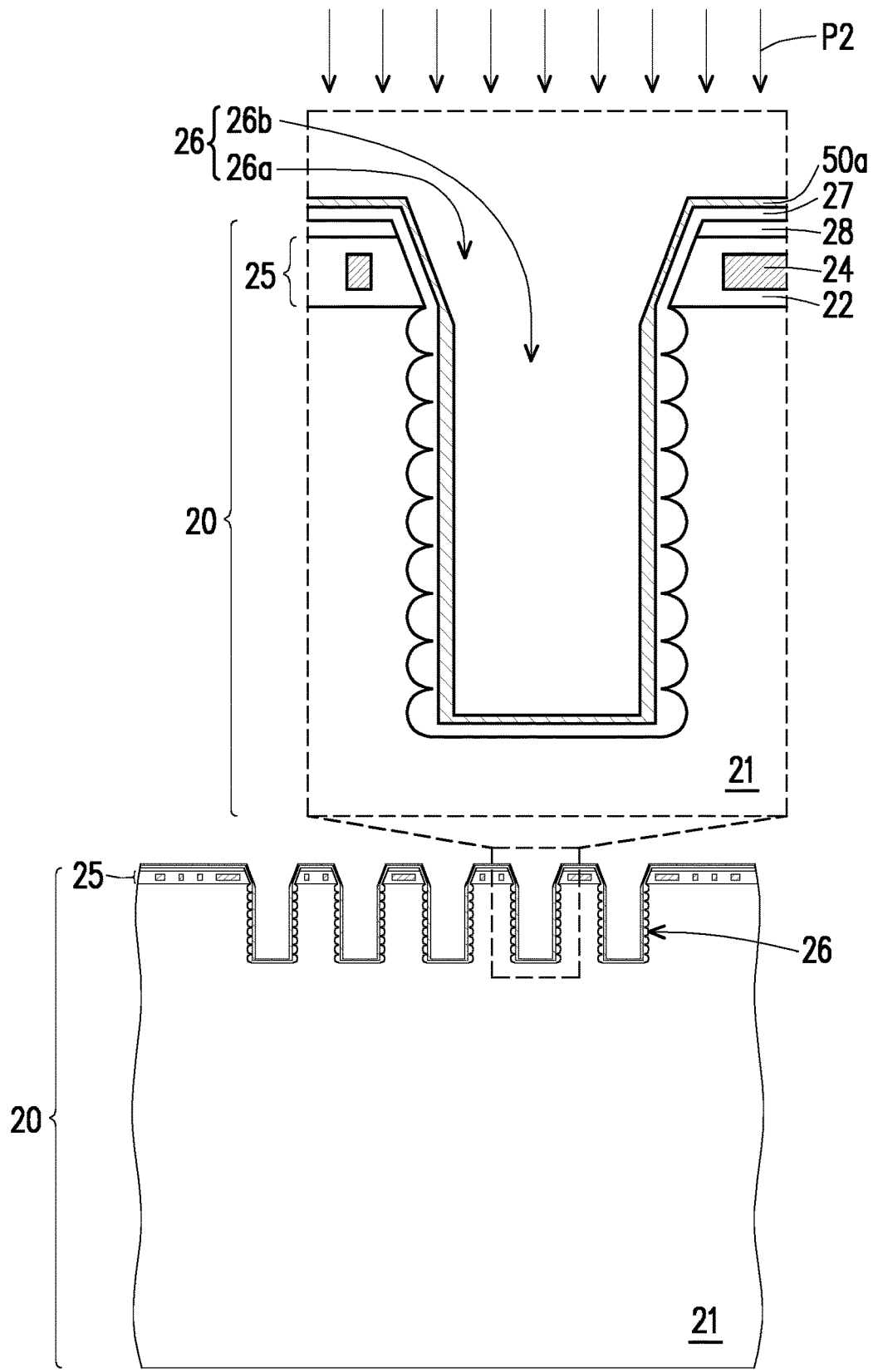

Referring to FIG. 1E, an etching process P2 is performed to the conductive layer so as to etch more from the horizontal portion than the vertical portion of the conductive layer 50a. In some embodiments, the etching process P2 is an in-situ etching. Specifically, the deposition process P1 and the etching process P2 are performed in the same process chamber. However, the disclosure is not limited thereto. In other embodiments, the deposition process P1 and the etching process P2 are performed in different process chambers.

In some embodiments, upon one cycle of the deposition process P1 and the etching process P2, the remaining conductive layer 50a is formed with different thicknesses in each via 26 and on the passivation layer 28. Specifically, the conductive layer 50a is formed thicker on the sidewall of the lower opening 26b of the via 26 due to the directional etching process P2.

Figure 1F:
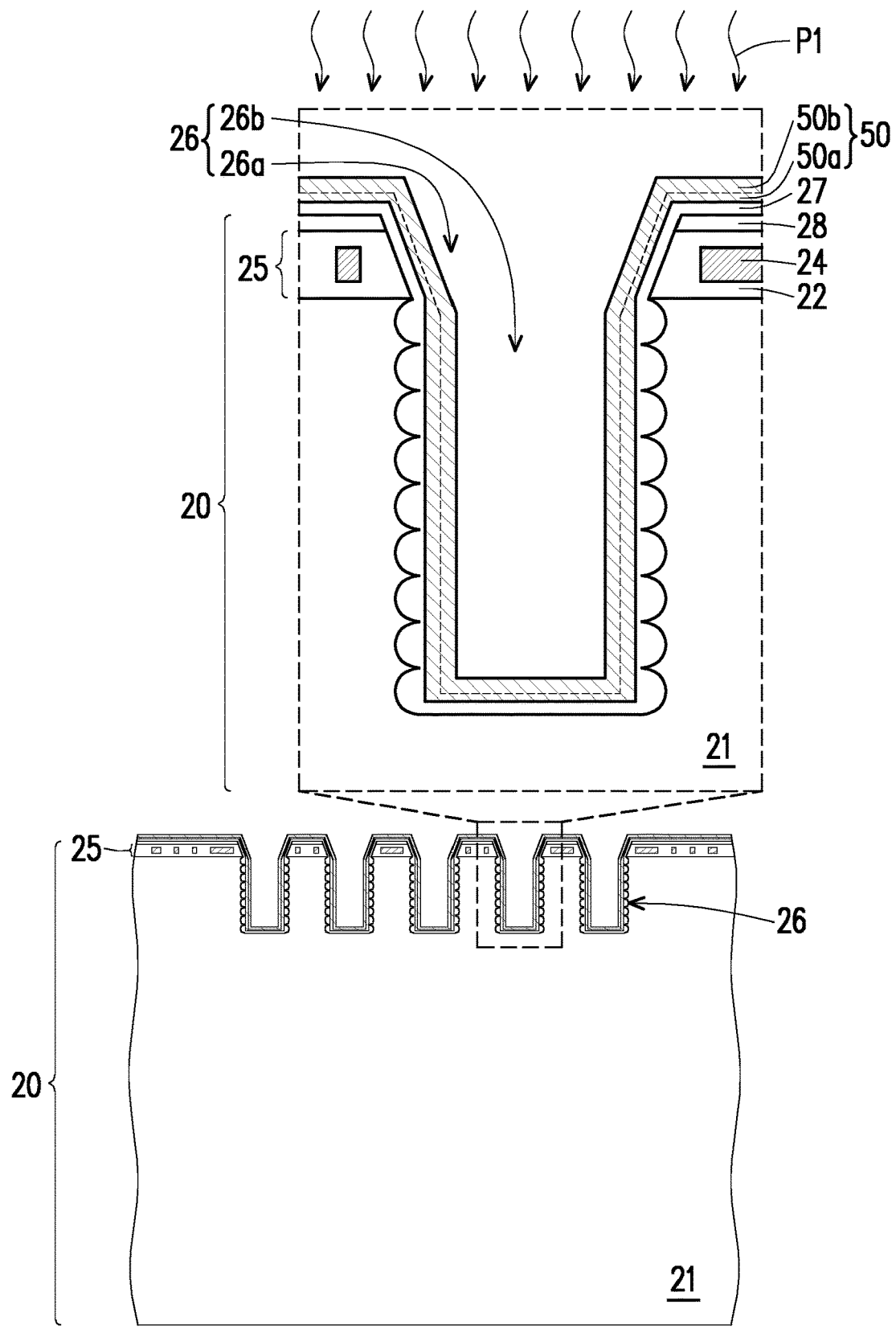
Figure 1G:
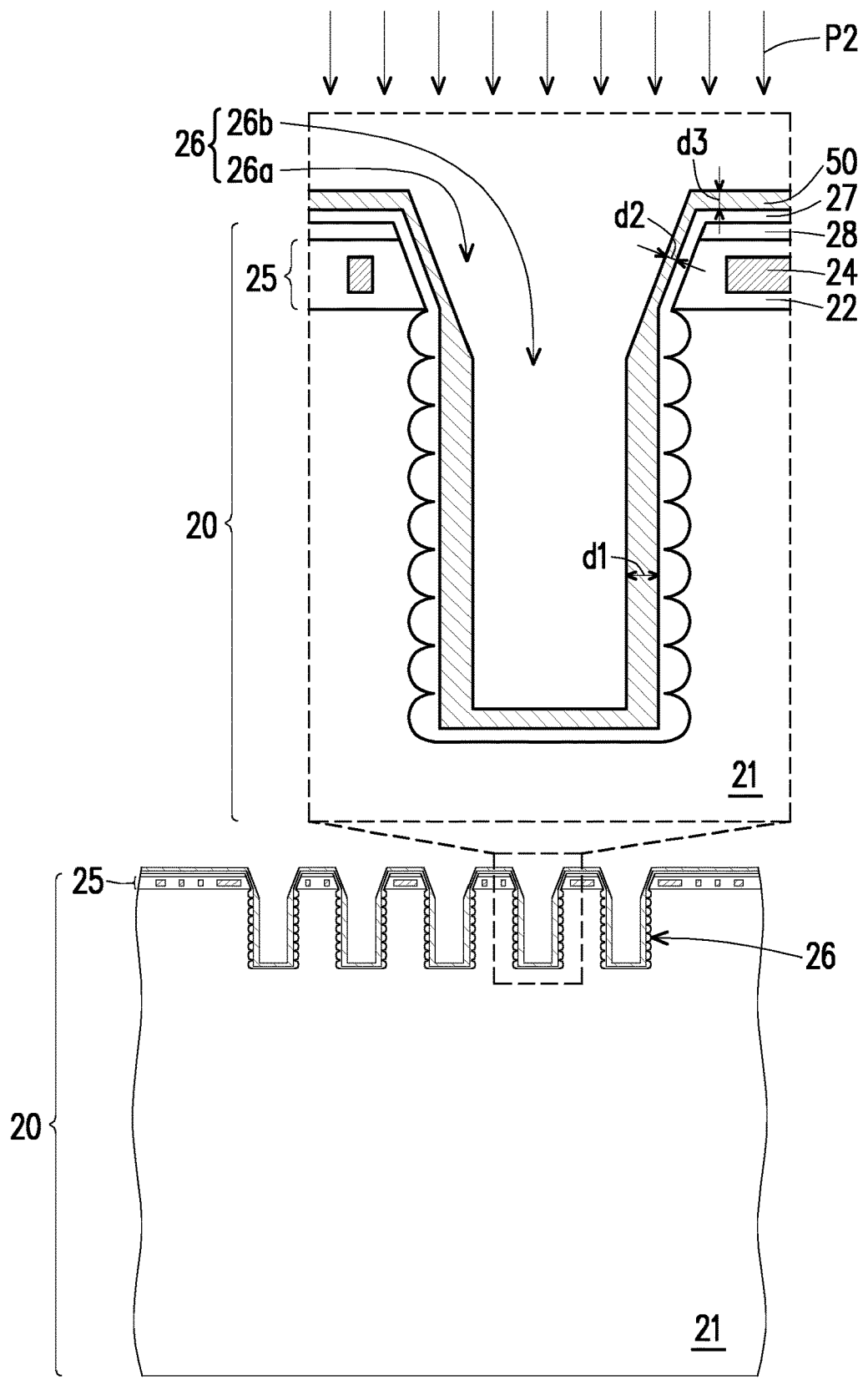

Referring to FIG. 1F and FIG. 1G, another cycle of the deposition process P1 and the etching process P2 is performed, so as to obtain a conductive layer 50 with a desired thickness.

As shown in FIG. 1F, a deposition process P1 is performed, so as to form a conductive layer 50b on the conductive layer 50a. The conductive layer 50b may include one or more layers of Au, Ti, Cu, Ag and Ni or an alloy thereof. In some embodiments, the deposition process P1 includes a chemical vapor deposition (CVD) process, a physical vapor deposition (PVD) process including a sputtering, an atomic layer deposition (ALD) process, a plating or any other suitable film deposition method. In certain embodiments, a sputtering method is used to form the conductive layer 50b. In some embodiments, the conducive layer 50b has a substantially equal thickness ranging from about 0.05 um to 0.2 um.

In some embodiments, the conductive layer 50b and the conductive layer 50a are made by the same material. However, the disclosure is not limited thereto. The conductive layer 50b and the conductive layer 50a may include different materials in some alternative embodiments. The conductive layer 50b and the conductive layer 50a are collectively referred to as a conductive layer 50. In some embodiments, the interface between the conductive layer 50b and the conductive layer 50a may be invisible when they are made by the same material. In other embodiments, the interface between the conductive layer 50b and the conductive layer 50a may be present when they are made by different materials.

As shown in FIG. 1G, an etching process P2 is performed to the conductive layer so as to etch more from the horizontal portion than the vertical portion of the conductive layer 50b. In some embodiments, the etching process P2 is an in-situ etching. Specifically, the deposition process P1 and the etching process P2 are performed in the same process chamber. However, the disclosure is not limited thereto. In other embodiments, the deposition process P1 and the etching process P2 are performed in different process chambers.

From another point of view, the deposition process P1 of FIG. 1D and the etching process P2 of FIG. 1E constitute a cycle of a cyclic deposition and etching process. In the cyclic deposition and etching process, a deposition process P1 and an etching process P2 are performed successively and circularly without interruption. The above embodiments in which the cyclic deposition and etching process includes two cycles of deposition and etching steps are provided for illustration purposes, and are not construed as limiting the present disclosure. In some embodiments, the deposition process P1 of FIG. 1D and the etching process P2 of FIG. 1E may be performed alternately many times in some alternative embodiments, until the conductive layer 50 is formed with a predetermined thickness. Specifically, the cyclic deposition and etching process may include m cycles of deposition and etching steps, and m is a positive integer. For example, m is an integer from 1 to 5, such as 2, 3 or 4. The cyclic deposition and etching process of the disclosure is beneficial to increase the thickness of the conductive layer 50 on the sidewalls of the vias 26.

In some embodiments, upon the cyclic deposition and etching process described above, the resulting conductive layer 50 is formed with different thicknesses. Specifically, the conductive layer 50 on the sidewall of the lower opening 26b has a thickness d1 ranging from about 0.5 um to 4 um, the conductive layer 50 on the sidewall of the upper opening 26a has a thickness d2 ranging from about 0.01 um to 2 um, and the conductive layer 50 on the surface of the circuit substrate 20 has a thickness d3 ranging from about 0.5 um to 4 um. In some embodiments, d1>d3>d2. In some embodiments, d1>d3=d2. Therefore, the ratio of d2/d3 is equal to or less than 1, and the ratio of d2/d1 is less than 1. However, the disclosure is not limited thereto. In other embodiments, d3>d1>d2.

In some embodiments, upon the process requirements, after forming the conductive layer 50, one or more optional conductive layers may be further formed on the conductive layer 50, so as to provide a multi-layer conductive structure on the sidewall of each of the through substrate vias. The optional conductive layers are formed with a method different from that of the conductive layer 50. For example, the optional conductive layers may be formed with a uniform thickness. In some embodiments, the multi-layer conductive structure includes a Ti/Al/Ti structure, a Ti/Cu/Ti structure or the like.

Figure 1H:
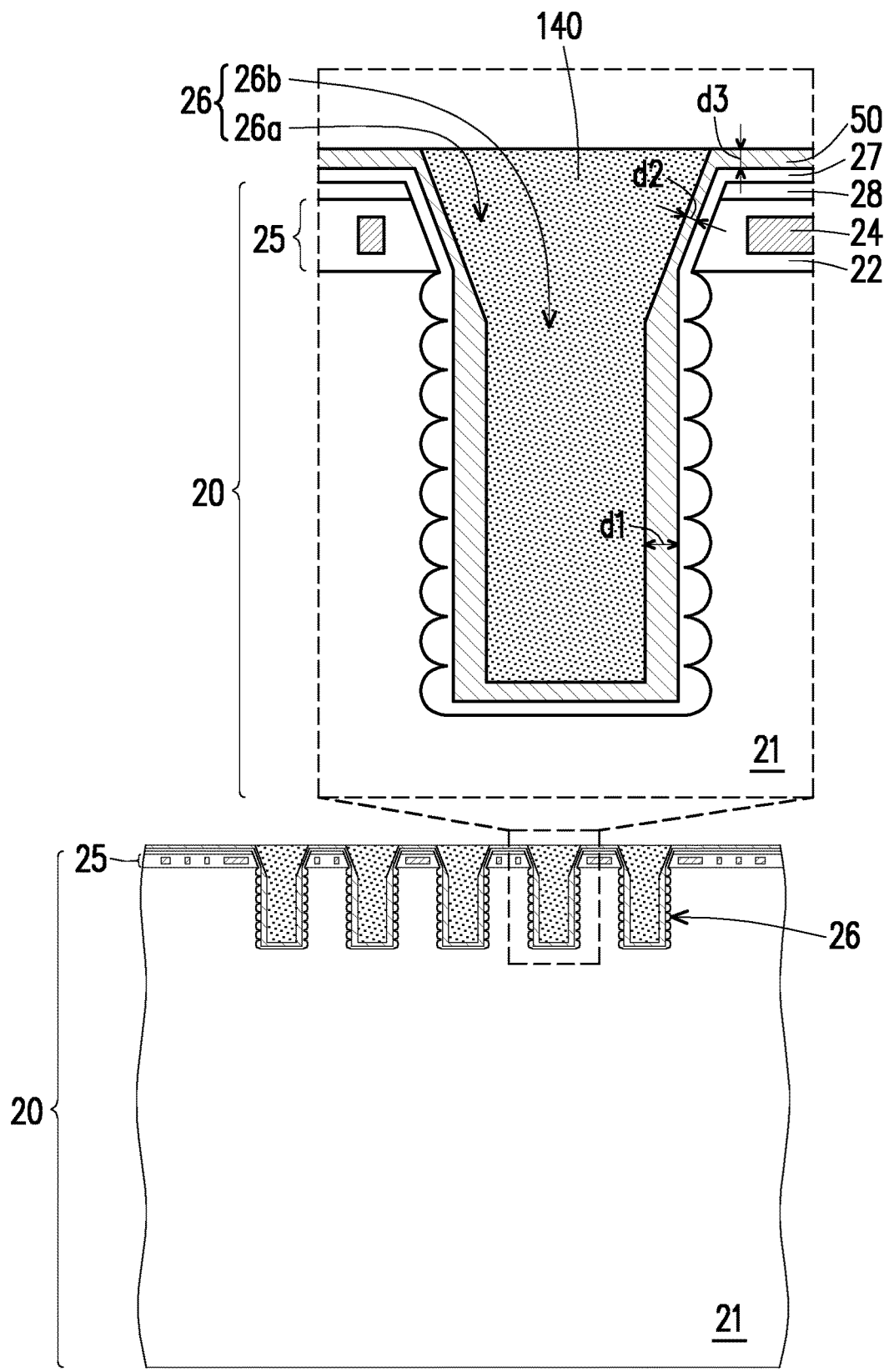

Referring to FIG. 1H, a filling layer 140 is formed to fill the vias 26 as shown in FIG. 1G. In some embodiments, the filling layer 140 includes silicon oxide, silicon nitride, silicon oxynitride or any other suitable insulating material. In certain embodiments, silicon oxide is used. In some embodiments, a blanket layer of a filling material is formed over the conductive layer 50 and then a planarization operation, such as a chemical mechanical polishing process or an etch-back process, is performed to leave the filling material only inside the vias 26, as shown in FIG. 1H. In other embodiments, the filling material is not formed.

Figure 1I:
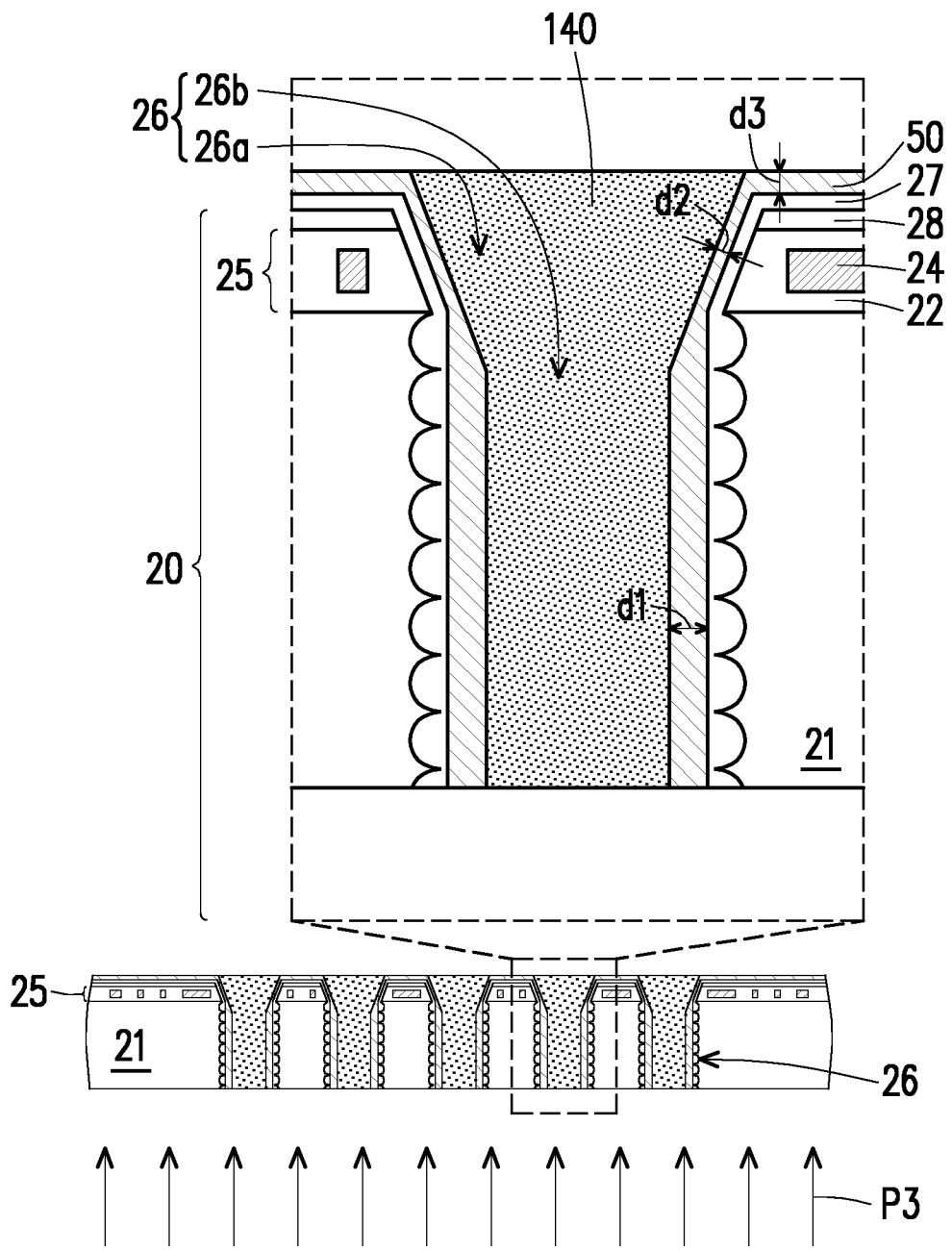

Referring to FIG. 1I, the back side of the circuit substrate 20 is thinned by a grinding or a polishing process P3. In some embodiments, the remaining thickness of the thinned circuit substrate 20 is in a range from about 12 um to about 140 um. In some embodiments, the back side of circuit substrate 20 is thinned until the filling layer 140 is exposed from the bottom of the via 26. Specifically, the conductive layer 50 and the liner layer 27 at the bottom of each via 26 are removed during the polishing process P3.

Figure 1J:
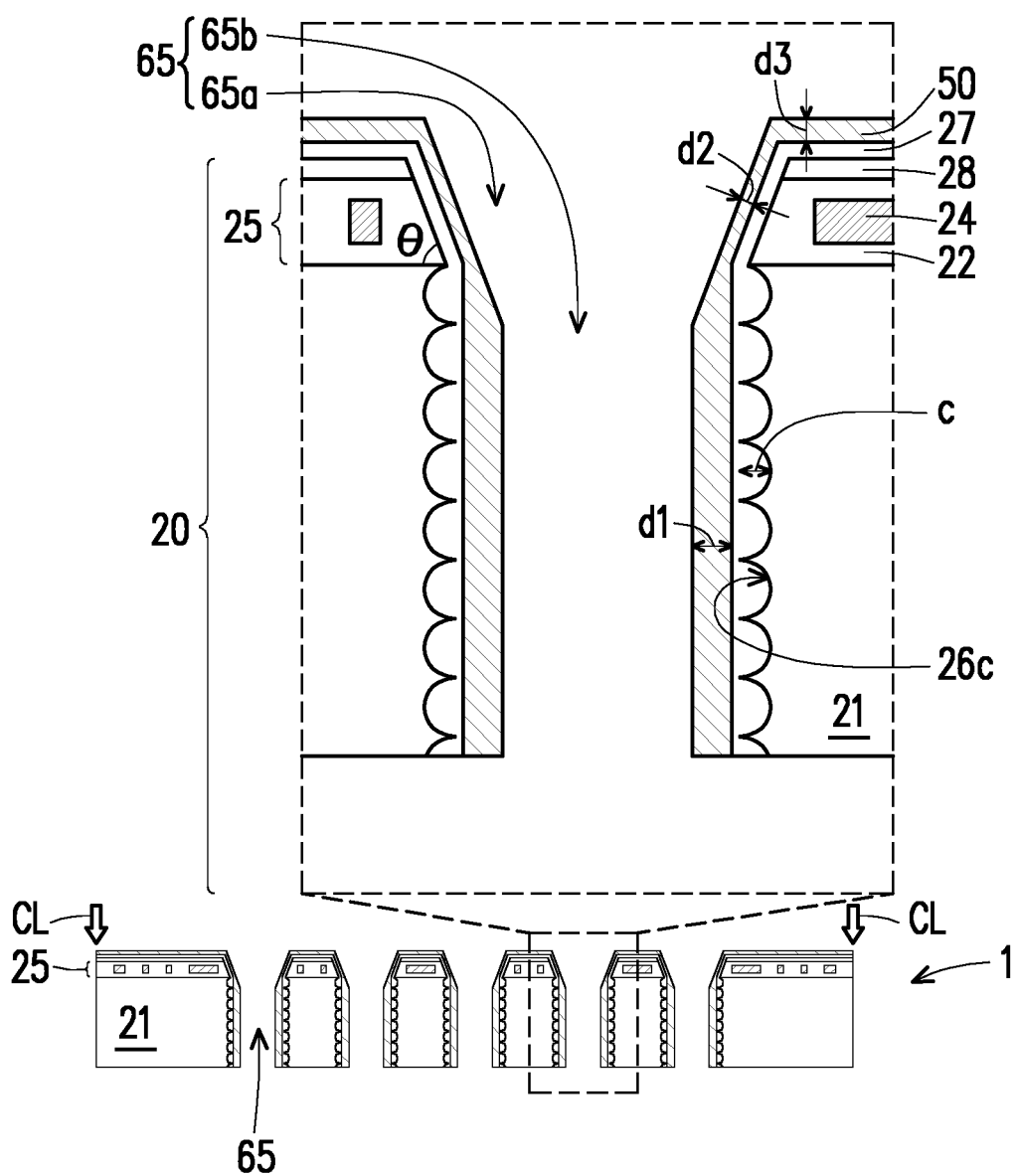

Referring to FIG. 1J, the circuit substrate 20 is singulated along scribe line regions CL between adjacent semiconductor devices by a singulation process, so as to separate a semiconductor device from an adjacent semiconductor device. Specifically, multiple semiconductor devices are formed on one wafer and the wafer is cut by sawing (a dicing operation) into individual semiconductor devices (chips), as shown by the arrows in FIG. 1J. Thereafter, the filling layer 140 is removed by an etching process, thereby forming, as shown in FIG. 1J. The through substrate vias 65 are referred to as "vias" or "through silicon vias" in some examples. A semiconductor device 1 of the disclosure is thus completed.

In the semiconductor device of the disclosure, a pre-passivation liner layer (e.g., oxide or nitride) is implemented before the metal sputtering process. With the pre-passivation liner layer, the Bosch process-induced wall scalloping can be smoothly filled-in creating a quite flat surface, which can resolve the problem of discontinuous metal layer caused by wall scalloping. Besides, a cyclic deposition and etching process is performed to achieve a thicker metal film at the sidewall of the TSV area. At the same time, the thickness of the metal film at the field area can be thinner than the sidewall of the TSV area by a directional etching process.

In some embodiments, the semiconductor device as a beam deflector is controllable such that it deflects the light beams towards selectable directions. In the disclosure, the conductive layer 50 formed continuously along the sidewall of the via 26 is thick enough, such that the conductive layer 50 is not likely to be damaged and broken into discontinuous parts when the light beams pass through the through substrate vias of the semiconductor device.

The above embodiments in which a semiconductor device of the disclosure is formed without a support substrate are provided for illustration purposes, and are not construed as limiting the present disclosure. In other embodiments, the semiconductor device of the disclosure can be provided in combination with a support substrate upon the process requirements.

FIG. 2A to FIG. 2F are schematic cross-sectional views of a method of manufacturing a semiconductor device according to alternative embodiments of the present disclosure. It is understood that the disclosure is not limited by the method described below. Additional operations can be provided before, during, and/or after the method and some of the operations described below can be replaced or eliminated, for additional embodiments of the methods. The order of the operations/processes may be interchangeable.

Figure 2A:
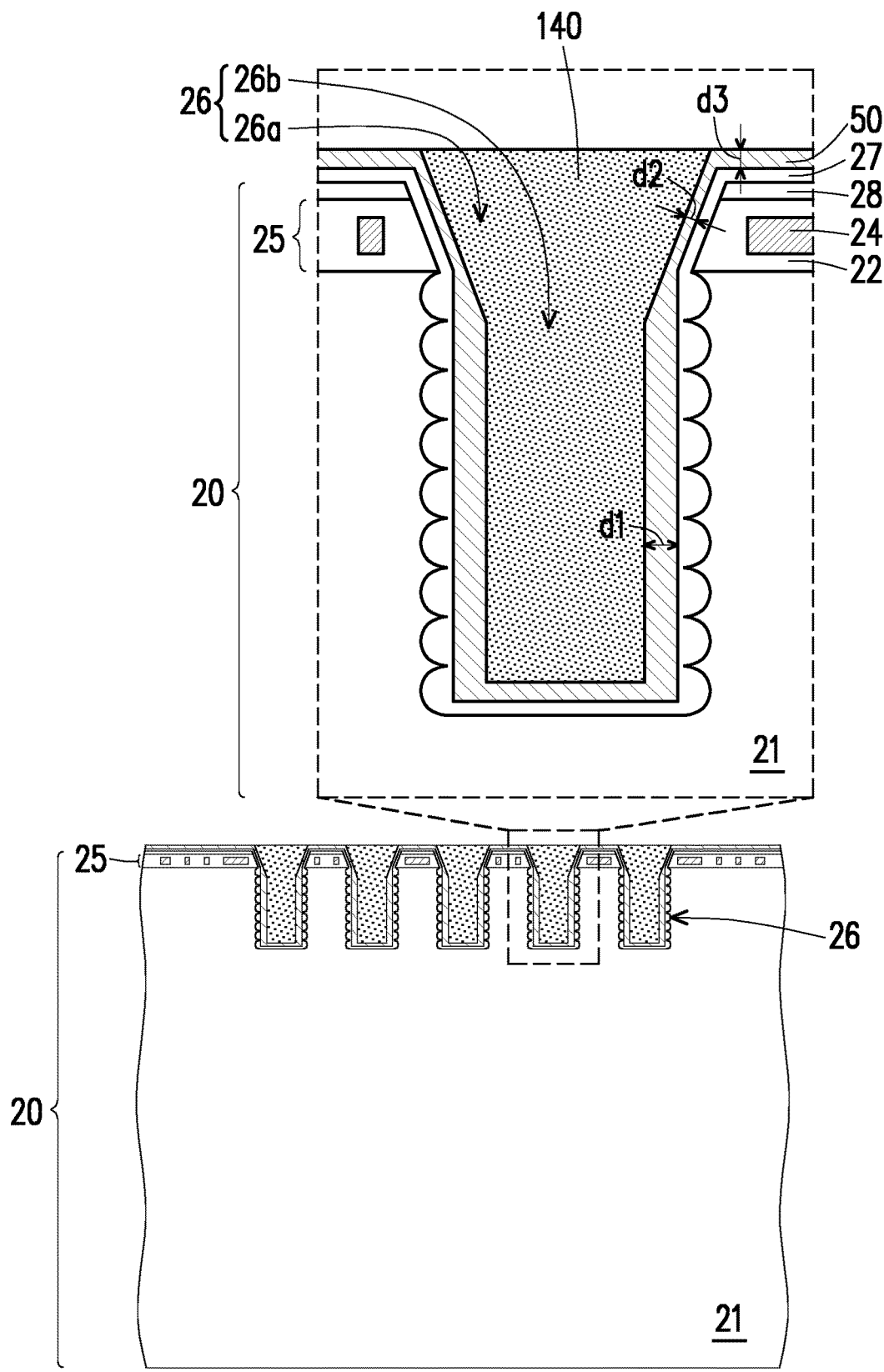
FIG. 2A to FIG. 2F are schematic cross-sectional views of a method of manufacturing a semiconductor device according to alternative embodiments of the present disclosure.

Referring to FIG. 2A, an intermediate structure similar to the structure of 1H is provided. In some embodiments, the operations of FIG. 1A to FIG. 1H are performed to form the structure of FIG. 2A. The elements configurations and forming methods have been described above, so the details are not iterated herein.

Figure 2B:
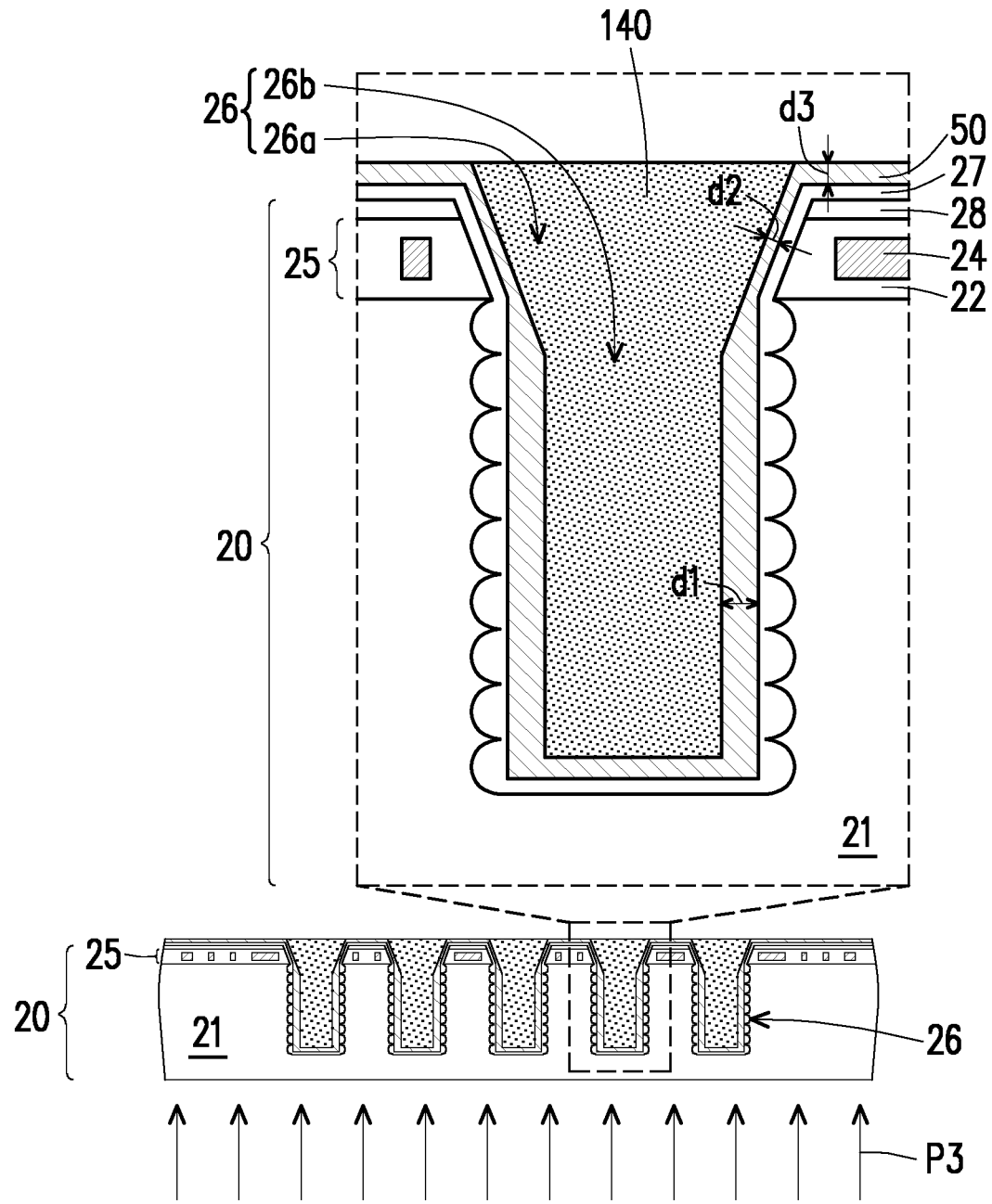

Referring to FIG. 2B, the back side of the circuit substrate 20 is thinned by a grinding or a polishing process P3. In some embodiments, the remaining thickness of the thinned circuit substrate 20 is in a range from about 100 μm to about 500 um.

Figure 2C:
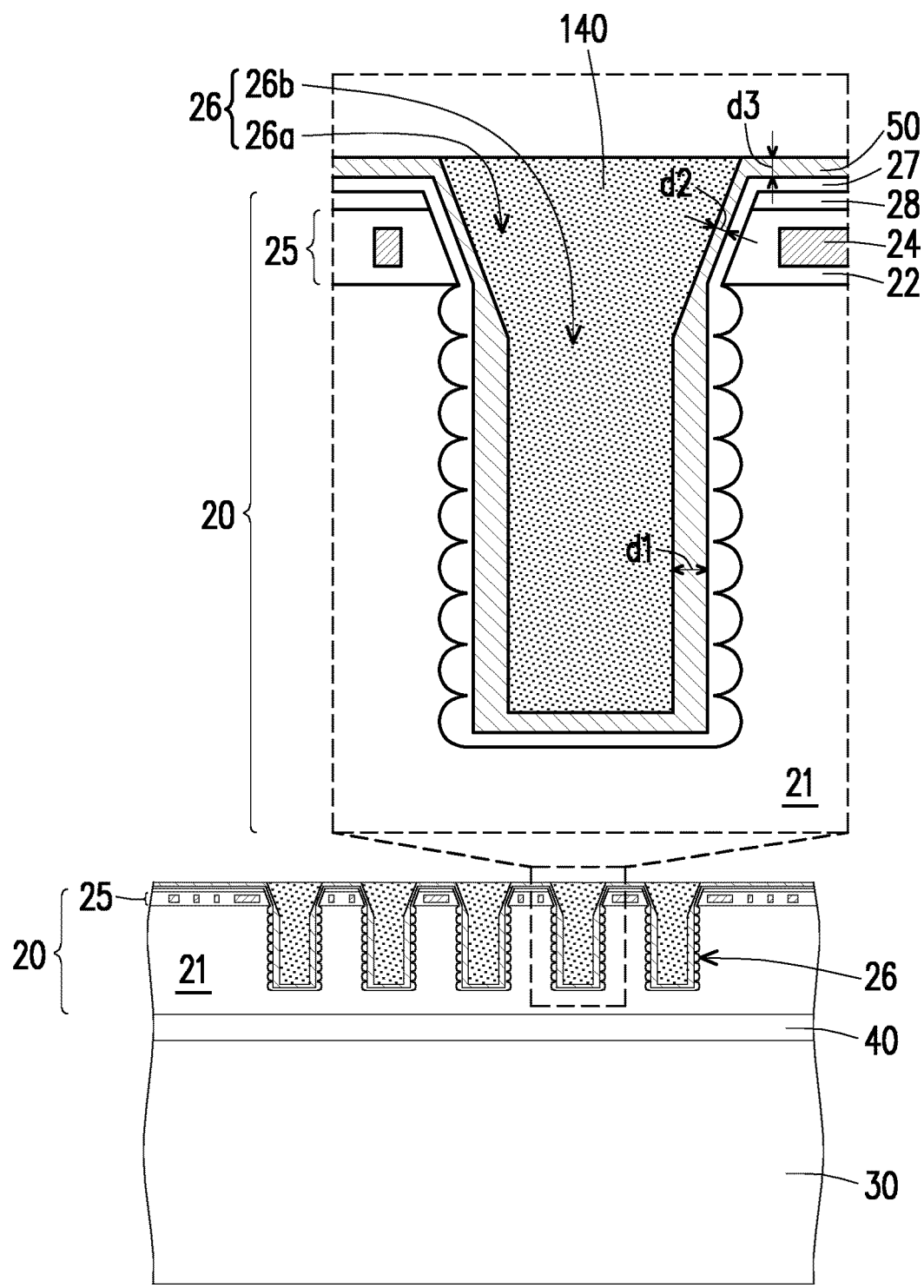

Referring to FIG. 2C, the thinned circuit substrate 20 is bonded to a support substrate 30 via a bonding layer 40. In some embodiments, the support substrate 30 includes an elementary semiconductor such as silicon, germanium and/or a compound semiconductor such as silicon germanium, silicon carbide, gallium arsenic, indium arsenide, gallium nitride or indium phosphide. For example, the support substrate 30 is a silicon-on-insulator (SOI) substrate or a silicon substrate. In some embodiments, the support substrate 30 is free of a device. The support substrate 30 is referred to as a "device-free support" in some examples. In some embodiments, the support substrate 30 is provided as a wafer-type substrate at this stage. The support substrate 30 is referred to as a "support wafer", "silicon support" or "silicon frame" in some examples.

In some embodiments, the bonding layer 40 includes silicon oxide, silicon nitride, silicon oxynitride, the like, or a combination thereof. In some embodiments, as shown in FIG. 2C, the bonding layer 40 is silicon oxide formed on the surface of the support substrate 30 by, for example, a thermal oxidation process or a chemical vapor deposition (CVD) process. In other embodiments, the bonding layer 40 is formed on the back side of the circuit substrate 20 by a CVD process. In some embodiments, the thickness of the bonding layer 40 is in a range from about 500 nm to about 5 um. In other embodiments, the thickness of the bonding layer 40 is in a range from about 1 um to 2 um. In some embodiments, the bonding layer 40 may be omitted.

Figure 2D:
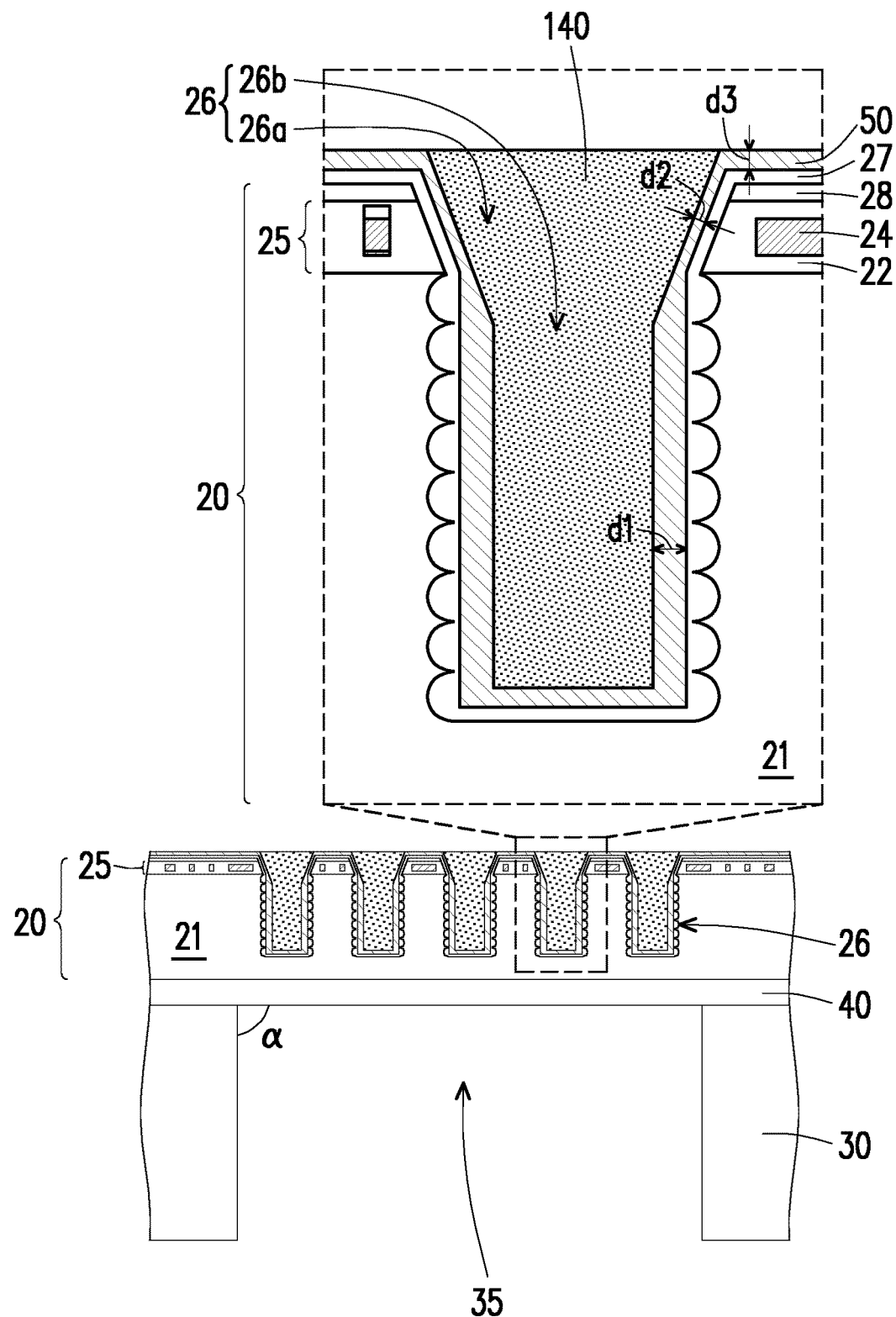

Referring to FIG. 2D, the back side of the support substrate 30 is recessed by using one or more lithography and etching operations. In some embodiments, the etching operation includes plasma dry etching or wet etching. In some embodiments, wet etching utilizes a tetramethylammonium hydroxide (TMAH) or KOH solution. In some embodiments, the bonding layer 40 functions as an etch stop layer for forming the recess as shown in FIG. 2D. In some embodiments, the included angle α between the sidewall and bottom of the recess 35 is about 90 degrees. However, the disclosure is not limited thereto. In other embodiments, the included angle α between the sidewall and bottom of the recess 35 is more than 90 degrees, such as from about 90.5 to 155 degrees.

Figure 2E:
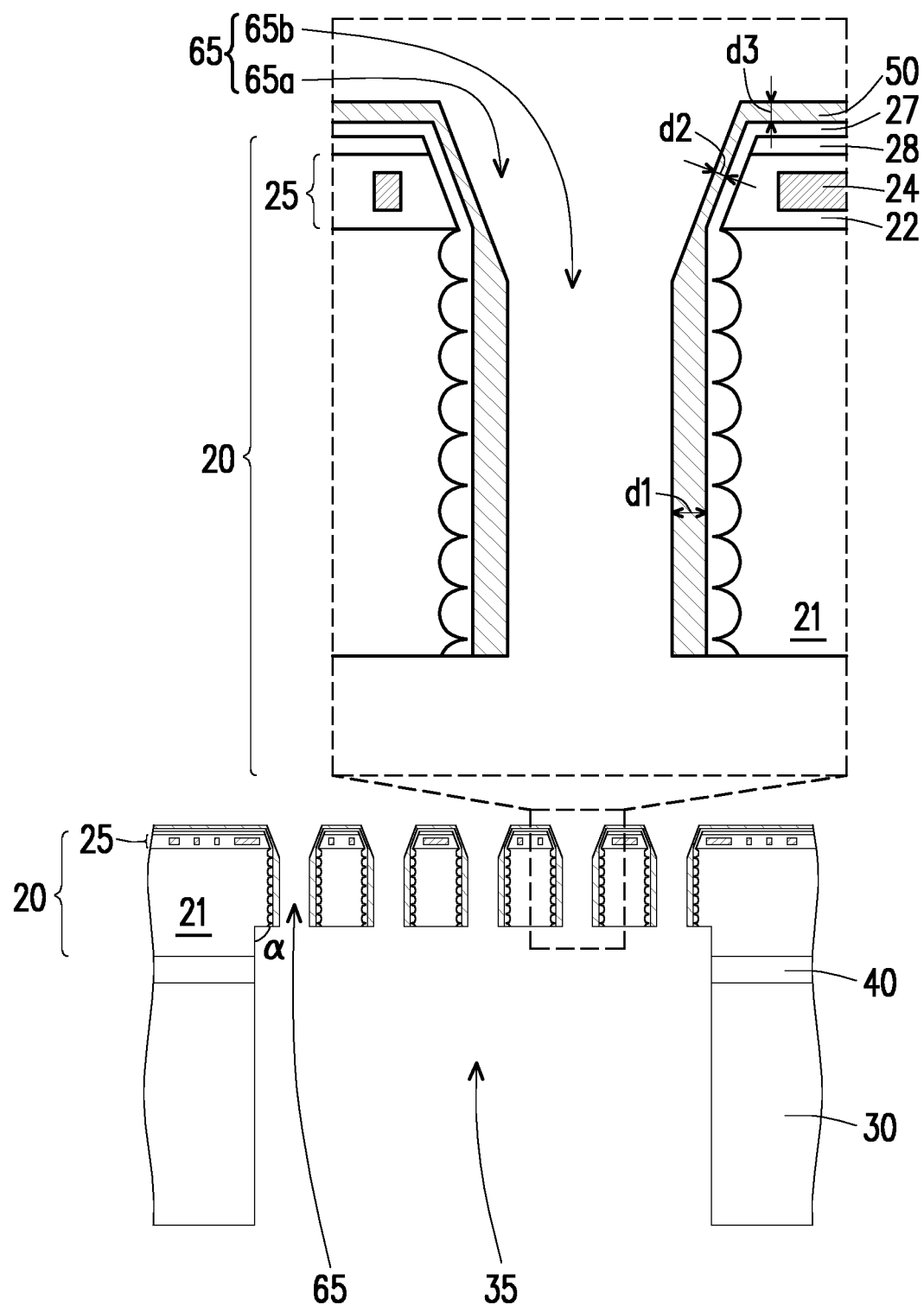

Referring to FIG. 2E, the bonding layer 40 exposed by the recess 35 is subsequently removed by a suitable etching operation. Then, the backside of the circuit substrate 20 is etched to expose the filling layer 140 filled in the vias 26. The filling layer 140 is then removed, thereby forming through substrate vias 65, as shown in FIG. 2E.

Figure 2F:
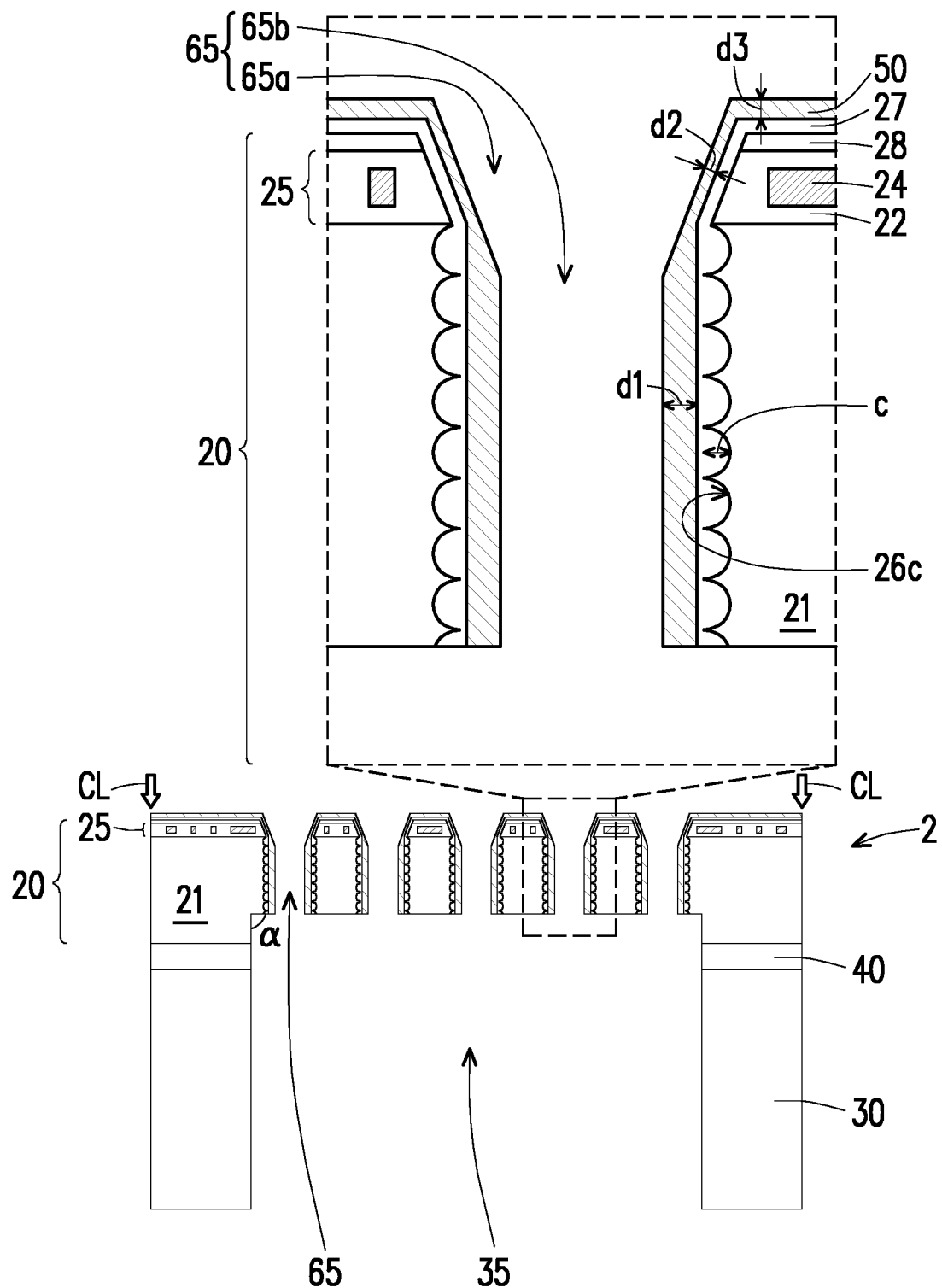

Referring to FIG. 2F, the circuit substrate 20 and the underlying support substrate are singulated along scribe line regions CL between adjacent semiconductor devices by a singulation process, so as to separate a semiconductor device from an adjacent semiconductor device. Specifically, multiple semiconductor devices are formed on one wafer and the wafer is cut by sawing (a dicing operation) into individual semiconductor devices (chips), as shown by the arrows in FIG. 2F. A semiconductor device 2 of the disclosure is thus completed.

In the above embodiments of FIG. 1J and FIG. 2F, the sidewall scallops or concave portions 26c of the through substrate vias 65 are provided with similar sizes. However, the disclosure is not limited thereto. In other embodiments, the sizes of the sidewall scallops of the through substrate vias may be varied, as shown in FIG. 3 to FIG. 6.

Figure 3:
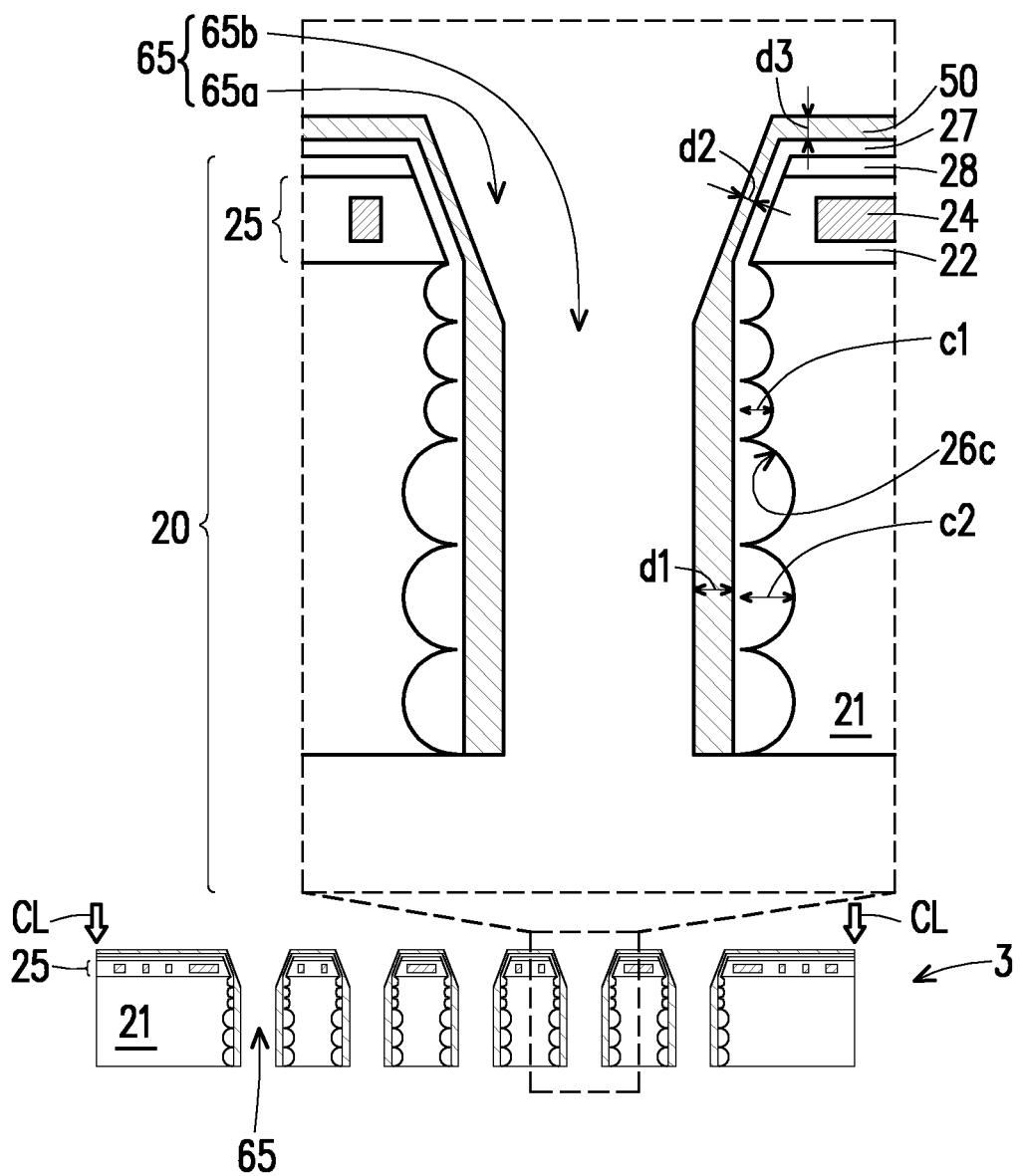
FIG. 3 to FIG. 11 are cross-sectional views of various semiconductor devices according to some embodiments of the present disclosure.
Figure 4:
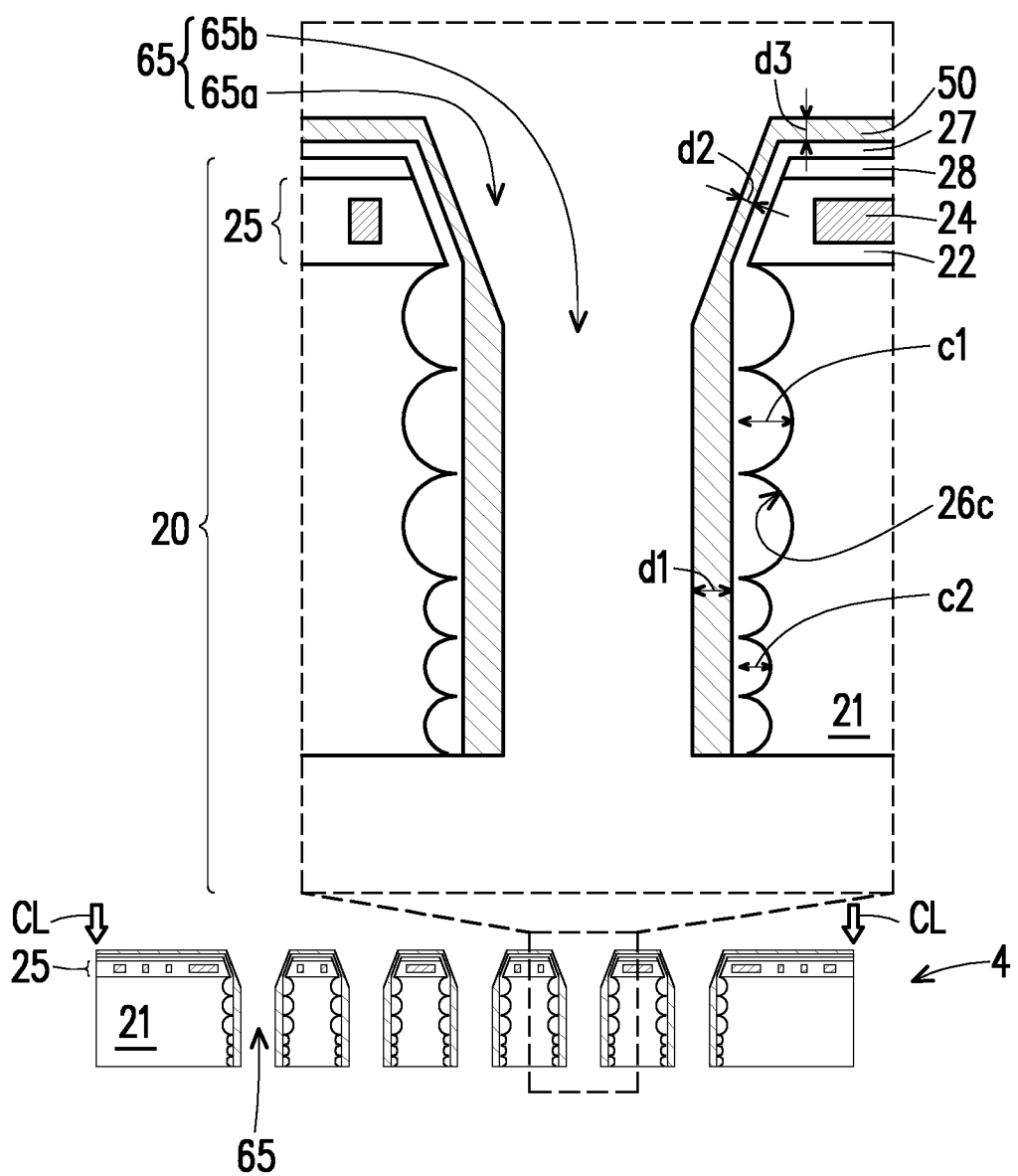
Figure 5:
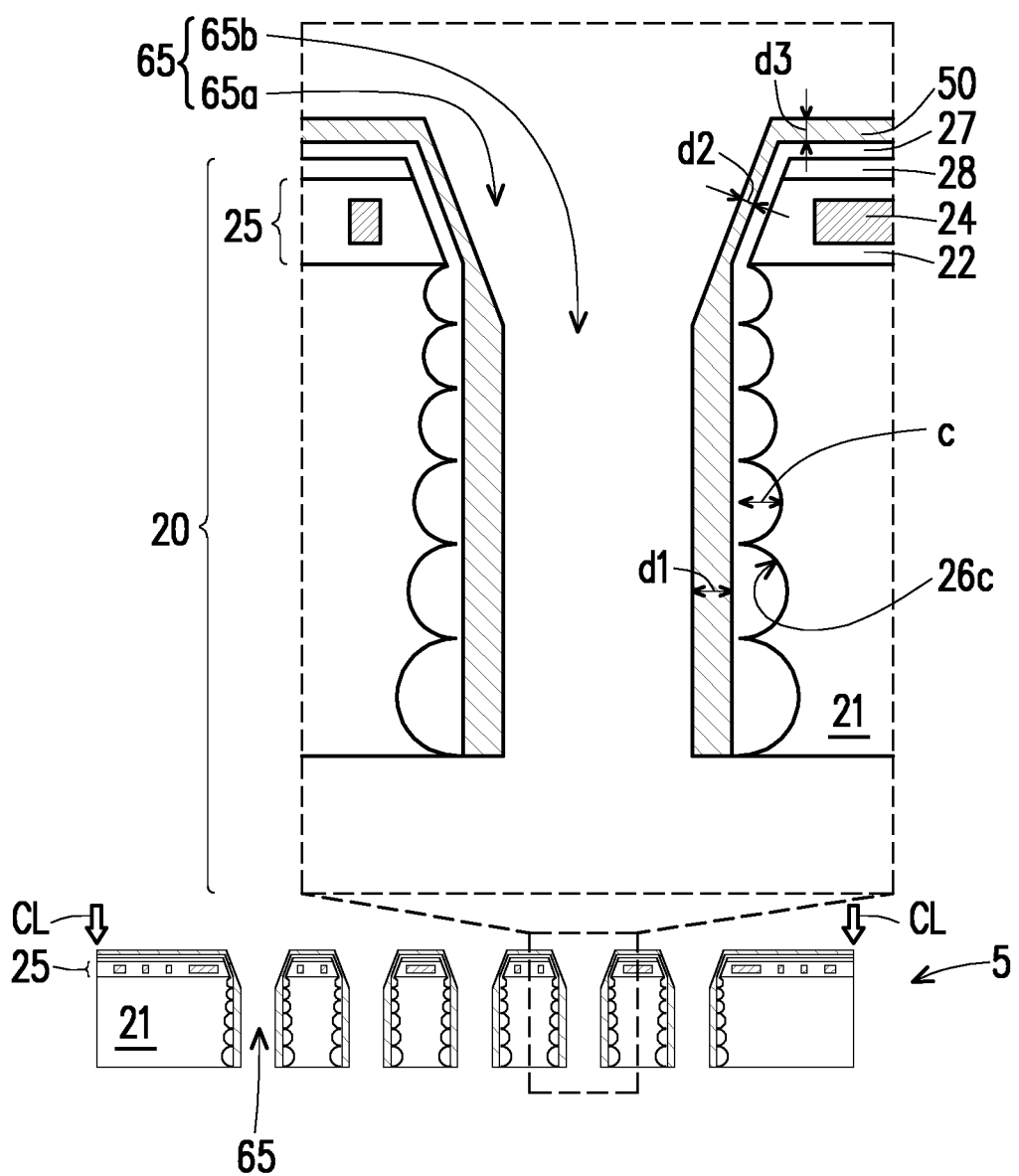
Figure 6:
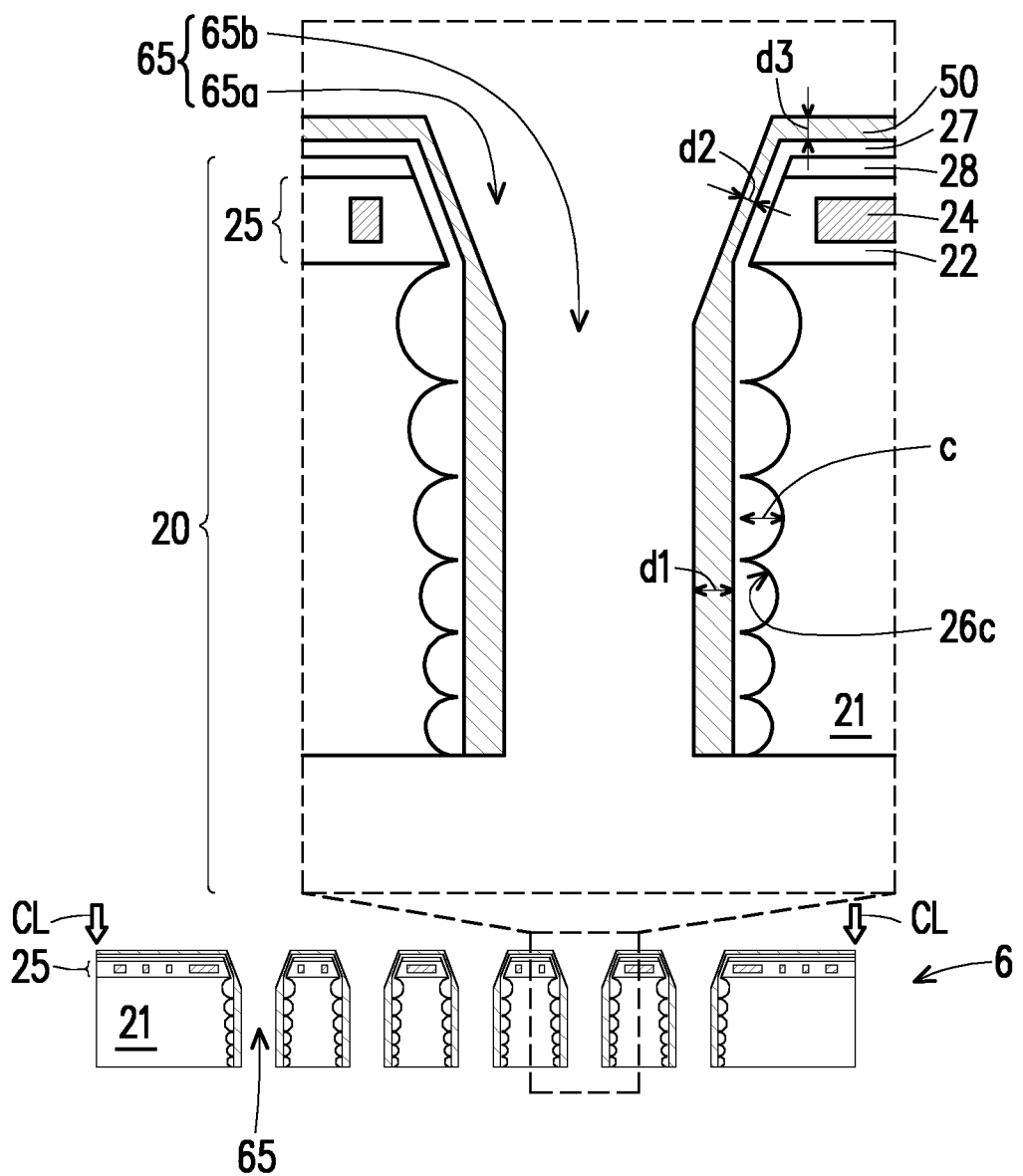

In the semiconductor structures 3-6 of FIG. 3 to FIG. 6, the sidewall scallops or concave portions 26c of the through substrate vias 65 have different sizes. As shown in FIG. 3, the upper concave portions 26c has a width c1, the lower concave portions 26c has a width c2, and the width c1 is less than the width c2. As shown in FIG. 4, the upper concave portions 26c has a width c1, the lower concave portions 26c has a width c2, and the width c1 is greater than the width c2. As shown in FIG. 5, the sizes or widths c of the concave portions 26c are gradually increased away from the front side of the circuit substrate 20. As shown in FIG. 6, the sizes or widths c of the concave portions 26c are gradually decreased away from the front side of the circuit substrate 20.

In the above embodiments of FIG. 2F, the support substrate 30 is provided having a single recess with a substantially vertical sidewall. However, the disclosure is not limited thereto. In other embodiments, the support substrate 30 can have other configurations, as shown in FIG. 7 to FIG. 11.

Figure 7:
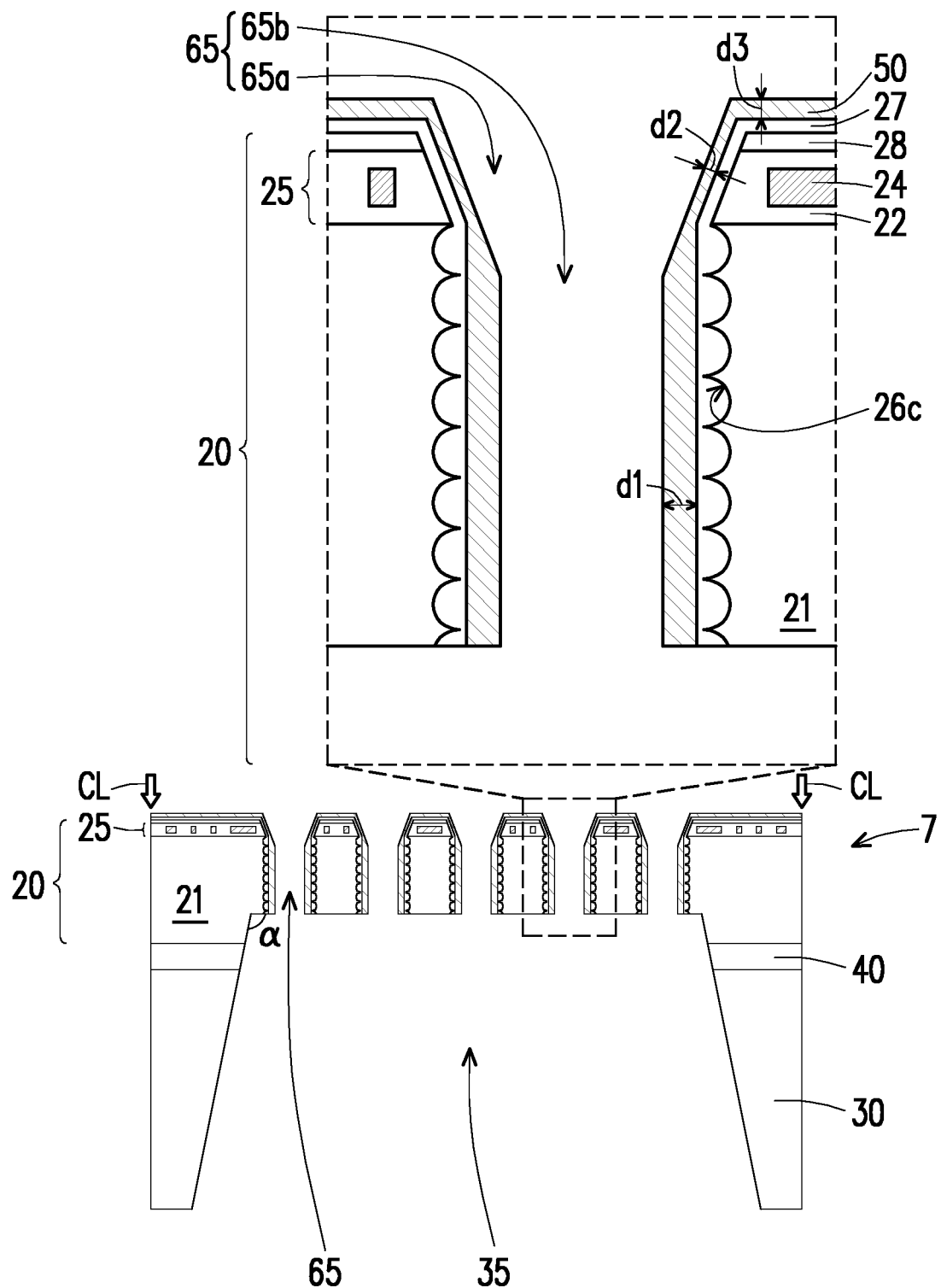

In the semiconductor structure 7 of FIG. 7, the support substrate 30 is provided having a single recess 35 with a tilted sidewall. Specifically, as shown in FIG. 7, the included angle α between the sidewall and bottom of the recess 35 is more than 90 degrees.

In the semiconductor structures 8-11 of FIG. 8 to FIG. 11, the support substrate 30 is provided having multiple recesses 35 in spatial communication with the through substrate vias 65, respectively.

Figure 8:
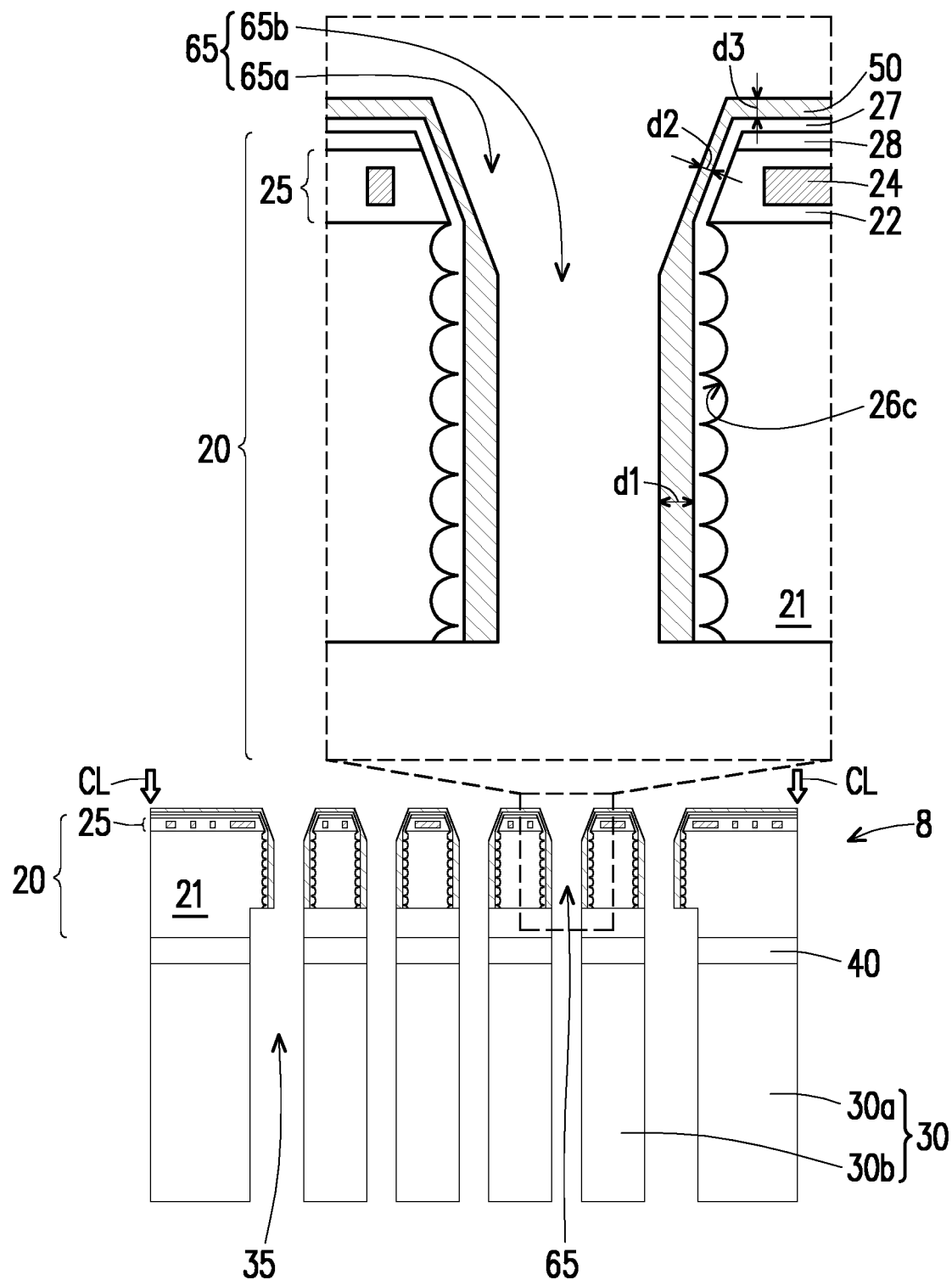
Figure 9:
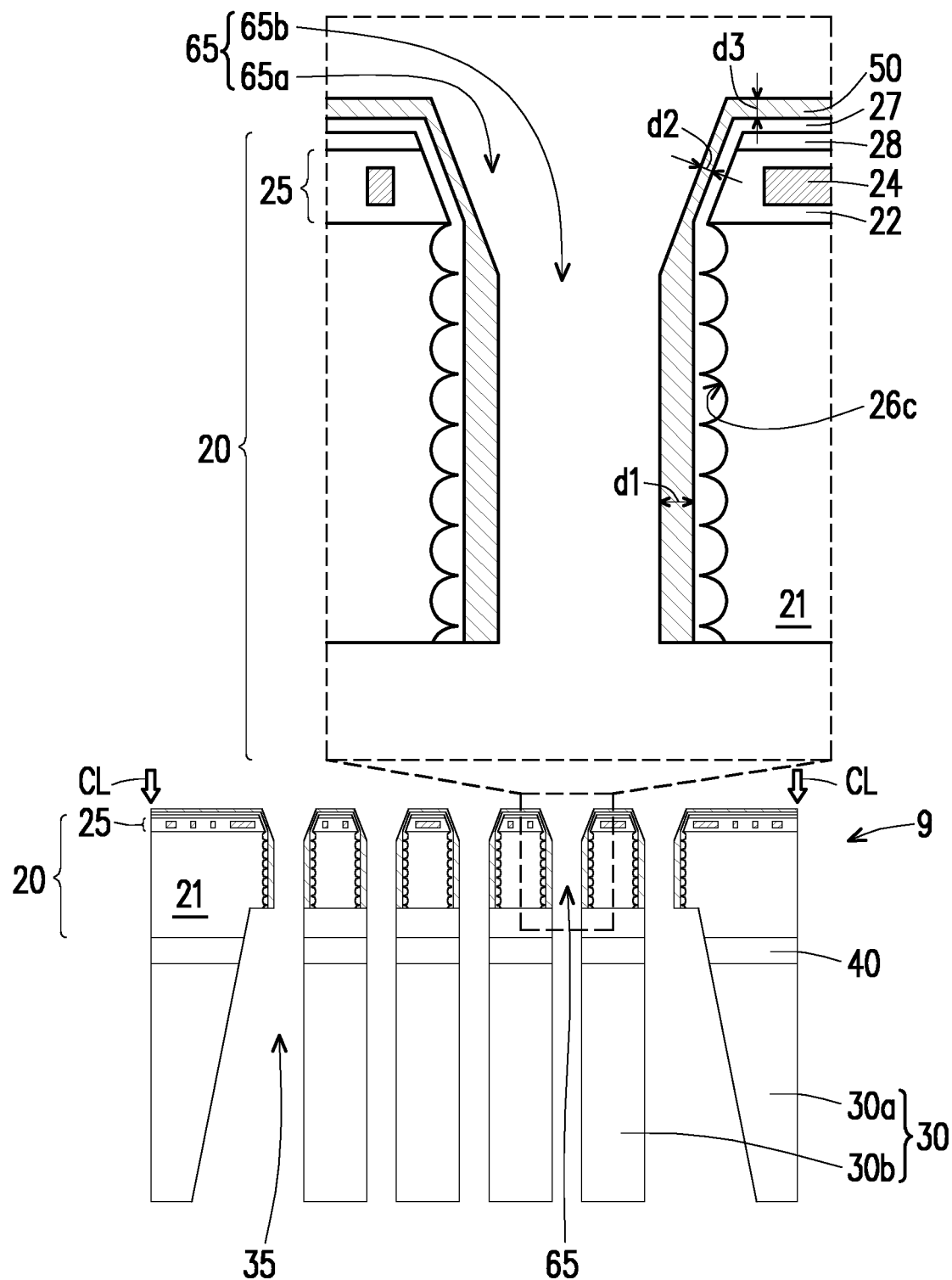

As shown in FIG. 8 to FIG. 9, the support substrate 30 includes first portions 30a and second portions 30b for supporting the overlying circuit substrate 20 with through substrate vias 65. The first portions 30a surround the second portions 30b.

In FIG. 8, each of the recesses 35 is provided with a symmetrical profile, e.g., having substantially vertical sidewalls facing each other. From another point of view, each of the first portions 30a and the second portions 30b has substantially vertical sidewalls opposite to each other.

In FIG. 9, the recesses 35 are provided with different profiles. The recess 35 between the first portion 30a and the adjacent second portion 30b has an unsymmetrical profile, while the recess 35 between the adjacent second portions 30b has a symmetrical profile. From another point of view, each of the first portions 30a has a substantially vertical sidewall and a tilted sidewall opposite to each other, and each of the second portions 30b has substantially vertical sidewalls opposite to each other.

Figure 10:
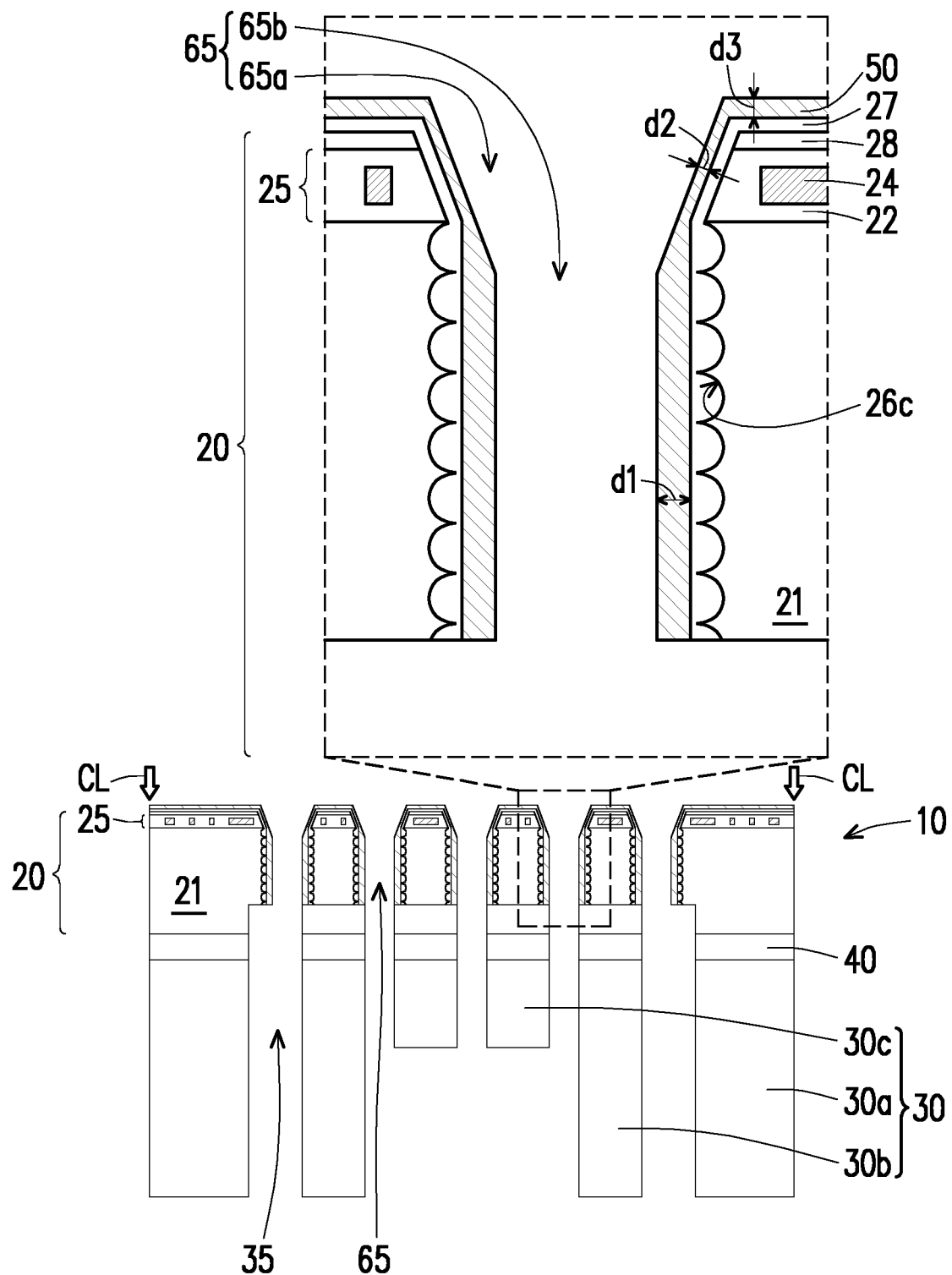
Figure 11:
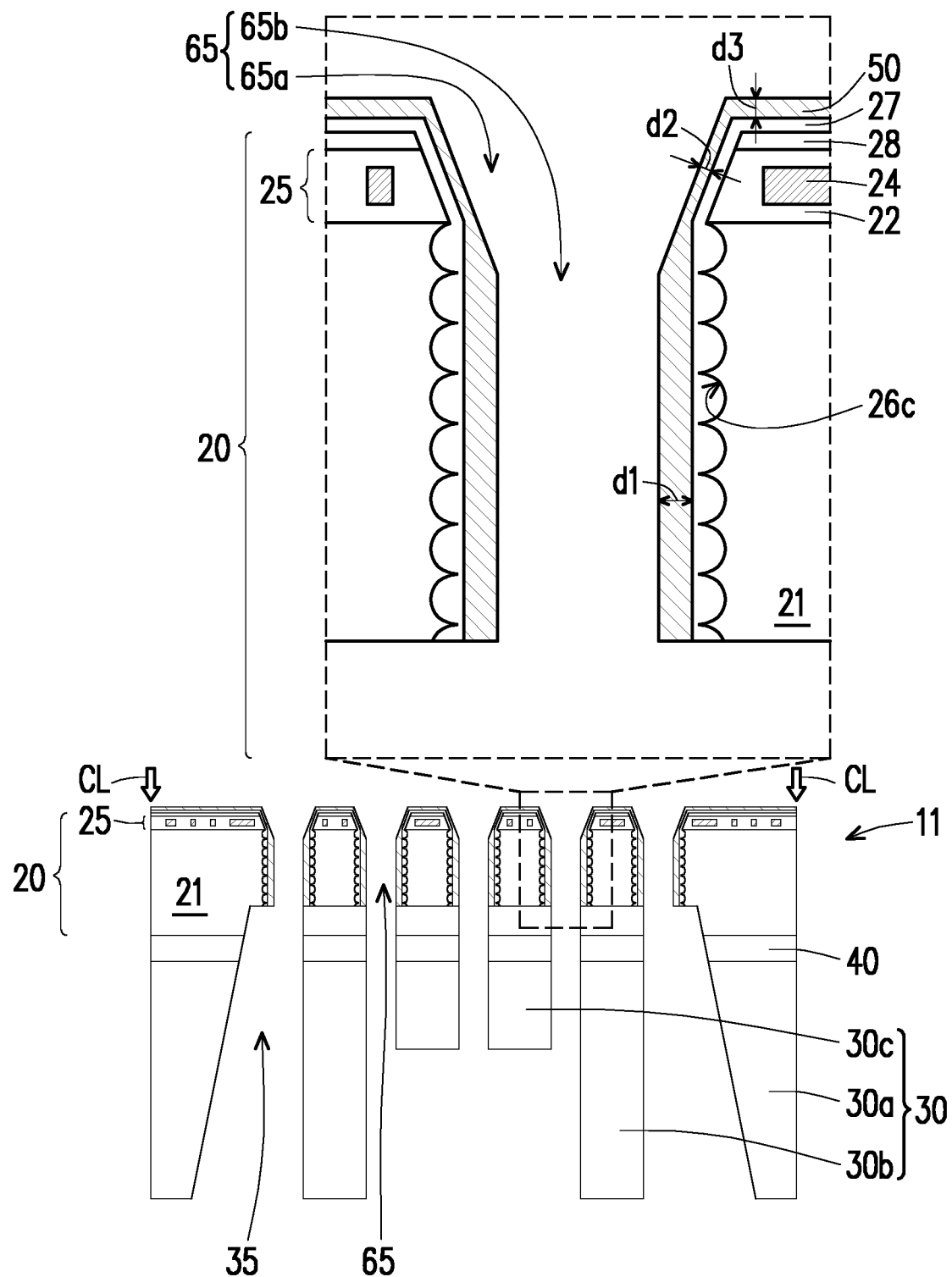

As shown in FIG. 10 to FIG. 11, the support substrate 30 includes first portions second portions 30b and third portions 30c for supporting the overlying circuit substrate 20 with through substrate vias 65. The first portions 30a surround the second portions 30b, and the second portions 30b surround the third portions 30c.

The semiconductor structure 10 of FIG. 10 is similar to the semiconductor structure 8 of FIG. 8, except that in FIG. 10, the central portions (e.g., third portions 30c) are shorter than the periphery portions (e.g., first and second portions 30a and 30b).

The semiconductor structure 11 of FIG. 11 is similar to the semiconductor structure 9 of FIG. 9, except that in FIG. 11, the central portions (e.g., third portions 30c) are shorter than the periphery portions (e.g., first and second portions 30a and 30b).

The shapes and configurations of the support substrates are not limited to the disclosure. It is appreciated by people having ordinary skill in the art that other shapes and configurations of the support substrates are possible. In other words, a support substrate is contemplated as falling within the spirit and scope of the present disclosure, as long as the support substrate is able to support the overlying circuit board including through substrate vias of the disclosure. Besides, the through substrate vias shown in FIG. 3 to FIG. 6 can replace the through substrate via of each of the semiconductor structures 7-11 in FIG. 7 to FIG. 11 upon the design requirements.

Figure 12:
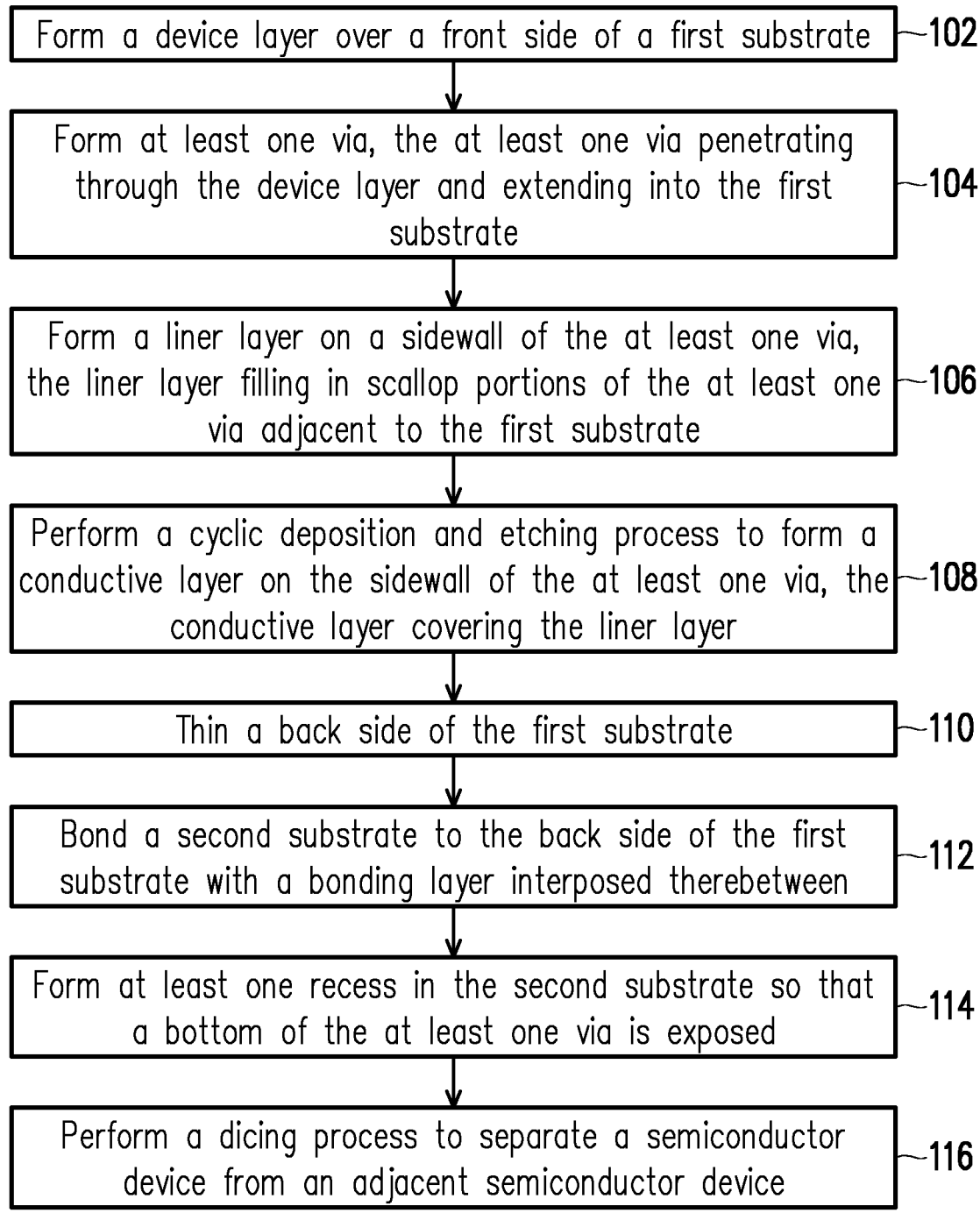
FIG. 12 illustrates a method of manufacturing a semiconductor device in accordance with some embodiments of the present disclosure.

FIG. 12 illustrates a method of forming a semiconductor device in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 102, a device layer is formed over a front side of a first substrate. FIG. 1A illustrates a cross-sectional view corresponding to some embodiments of act 102.

At act 104, at least one via is formed, and the at least one via penetrates through the device layer and extends into the first substrate. FIG. 1B illustrates a cross-sectional view corresponding to some embodiments of act 104. In some embodiments, the at least one via is formed to have a scallop-like sidewall in the first substrate. The sidewall scallops or concave portions of the at least one via may have different shapes and configurations, which have been described in FIG. 1J and FIG. 3 to FIG. 6.

At act 106, a liner layer is formed on a sidewall of the at least one via, and the liner layer fills in scallop portions of the at least one via adjacent to the first substrate. FIG. 1C illustrates a cross-sectional view corresponding to some embodiments of act 106.

At act 108, a cyclic deposition and etching process is performed to form a conductive layer on the sidewall of the at least one via, and the conductive layer covers the liner layer. FIG. 1D to FIG. 1G illustrate cross-sectional views corresponding to some embodiments of act 108. In some embodiments, the conductive layer is formed thicker on the sidewall of a lower part of the at least one through substrate via while thinner on the sidewall of an upper part of the at least one through substrate via.

At act 110, a back side of the first substrate is thinned. FIG. 1I and FIG. 2B illustrate cross-sectional views corresponding to some embodiments of act 110.

In some embodiments, the at least one via is filled with a filling material before the thinning operation at act 110. In some embodiments, at least one through substrate via is formed by removing the filling material after the thinning operation at act 110.

At act 112, a second substrate is bonded to the back side of the first substrate with a bonding layer interposed therebetween. FIG. 2C illustrates a cross-sectional view corresponding to some embodiments of act 112.

At act 114, at least one recess is formed in the second substrate so that a bottom of the at least one via is exposed. FIG. 2D to FIG. 2E illustrate cross-sectional views corresponding to some embodiments of act 114. One or more recesses of the second substrate may have different shapes and configurations, which have been described in FIG. 2F and FIG. 7 to FIG. 11.

In some embodiments, the at least one via is with a filling material before the thinning operation at act 110, and at least one through substrate via is formed by removing the filling material after forming the recess in the second substrate at act 114.

At act 116, a dicing process is performed to separate a semiconductor device from an adjacent semiconductor device. FIG. 1J and FIG. 2F illustrate cross-sectional views corresponding to some embodiments of act 116.

The structures of semiconductor devices of the disclosure are described below with reference to FIG. 1J, FIG. 2F and FIG. 3 to FIG. 11.

In some embodiments, a semiconductor device 1/2/3/4/5/6/7/8/9/10/11 includes a circuit substrate 20, at least one through substrate via 65, a liner layer 27 and a conductive layer 50. The circuit substrate 20 includes an electronic circuitry (e.g., device layer 25). The at least one through substrate via 65 passes through the circuit substrate 20. The at least one through substrate via 65 includes a plurality of concave portions 26c on a sidewall thereof. The liner layer 27 fills in the plurality of concave portions 26c of the at least one through substrate via 65. The conductive layer 50 is disposed on the sidewall of the at least one through substrate via, covers the liner layer 27, and extends onto a surface of the circuit substrate 20. The thickness of the conductive layer 50 on the sidewall of the at least one through substrate via 65 is varied. In some embodiments, the conductive layer 50 includes one or more layers of Au, Ti, Ni, Ag and Cu or an alloy thereof.

In some embodiments, the at least one through substrate via 65 has a lower opening and an upper opening 65a wider than the lower opening 65a. In some embodiments, the upper opening 65a has a tilted and smooth sidewall, and the plurality of concave portions 26c are arranged along the sidewall of the lower opening 65b. In some embodiments, the electronic circuitry (e.g., device layer 25) is disposed aside the upper opening 65a of the at least one through substrate via 65.

In some embodiments, the thickness d2 of the conductive layer 50 on the sidewall of the upper opening 65a is less than the thickness d1 of the conductive layer 50 on the sidewall of the lower opening 65b of the at least one through substrate via 65. In some embodiments, the thickness d2 of the conductive layer 50 on the sidewall of the upper opening 65a is equal to or less than a thickness d3 of the conductive layer 50 on the surface of the circuit substrate 20.

In some embodiments, the semiconductor device further includes a support substrate 30 and a bonding layer 40. The support substrate 30 has at least one recess 35. The bonding layer 40 is disposed between the circuit substrate 20 and the support substrate 30, and the at least one through substrate via 65 is in spatial communication with the recess 35 of the support substrate 30. In some embodiments, no bonding layer is disposed in the recess 35.

In some embodiments, a semiconductor device 1/2/3/4/5/6/7/8/9/10/11 includes a circuit substrate 20, a passivation layer 28, at least one through substrate via 65, a conductive layer 50 and an insulating liner layer 27. The circuit substrate 20 includes a semiconductor substrate 21 and a device layer 25 over the semiconductor substrate 21. The passivation layer 28 is disposed over the device layer 25. The at least one through substrate via 65 passes through passivation layer 28, the device layer 25 and the semiconductor substrate 21. The conductive layer 50 covers the passivation layer 28 and an inner sidewall of the at least one through substrate via 65. In some embodiments, a thickness of the conductive layer 50 on the inner sidewall of the at least one through substrate via 65 is not uniform. The insulating liner layer 27 is disposed between the conductive layer 50 and the semiconductor substrate 21 of the circuit substrate 20, and the insulating liner layer 27 has a scallop-like sidewall facing the semiconductor substrate 21 and a substantially smooth sidewall facing the conductive layer 50.

In some embodiments, the scallop-like sidewall of the insulating liner layer 27 includes a plurality of concave portions 26c, and widths of the concave portions 26c are uniform, as shown in FIG. 1J and FIG. 2F. In some embodiments, the scallop-like sidewall of the insulating liner layer 27 includes a plurality of concave portions 26c, and widths of the concave portions 26c are not uniform, as shown in FIG. 3 to FIG. 6.

In some embodiments, an included angle θ between an upper opening 65a of the inner sidewall of the at least one through substrate via 65 and the bottom surface of the device layer 25 is less than about 90 degrees. From another point of view, the upper sidewall of the at least one through substrate via 65 is inclined away from a top edge of the at least one through substrate via 65.

In the disclosure, the conductive layer formed continuously along the sidewall of the via 26 is thick enough, such that the conductive layer 50 is not likely to be damaged and broken into discontinuous parts when the light beams pass through the through substrate vias of the semiconductor device. The semiconductor device as a beam deflector is controllable such that it deflects the light beam directed thereto into a selectable direction.

The above embodiments in which the semiconductor device of the disclosure serves as a beam controller is provided for illustration purposes, and are not construed as limiting the present disclosure. In other embodiments, the through substrate vias of the semiconductor device of the disclosure can function as heat dissipation elements, as shown in FIG. 13.

Figure 13:
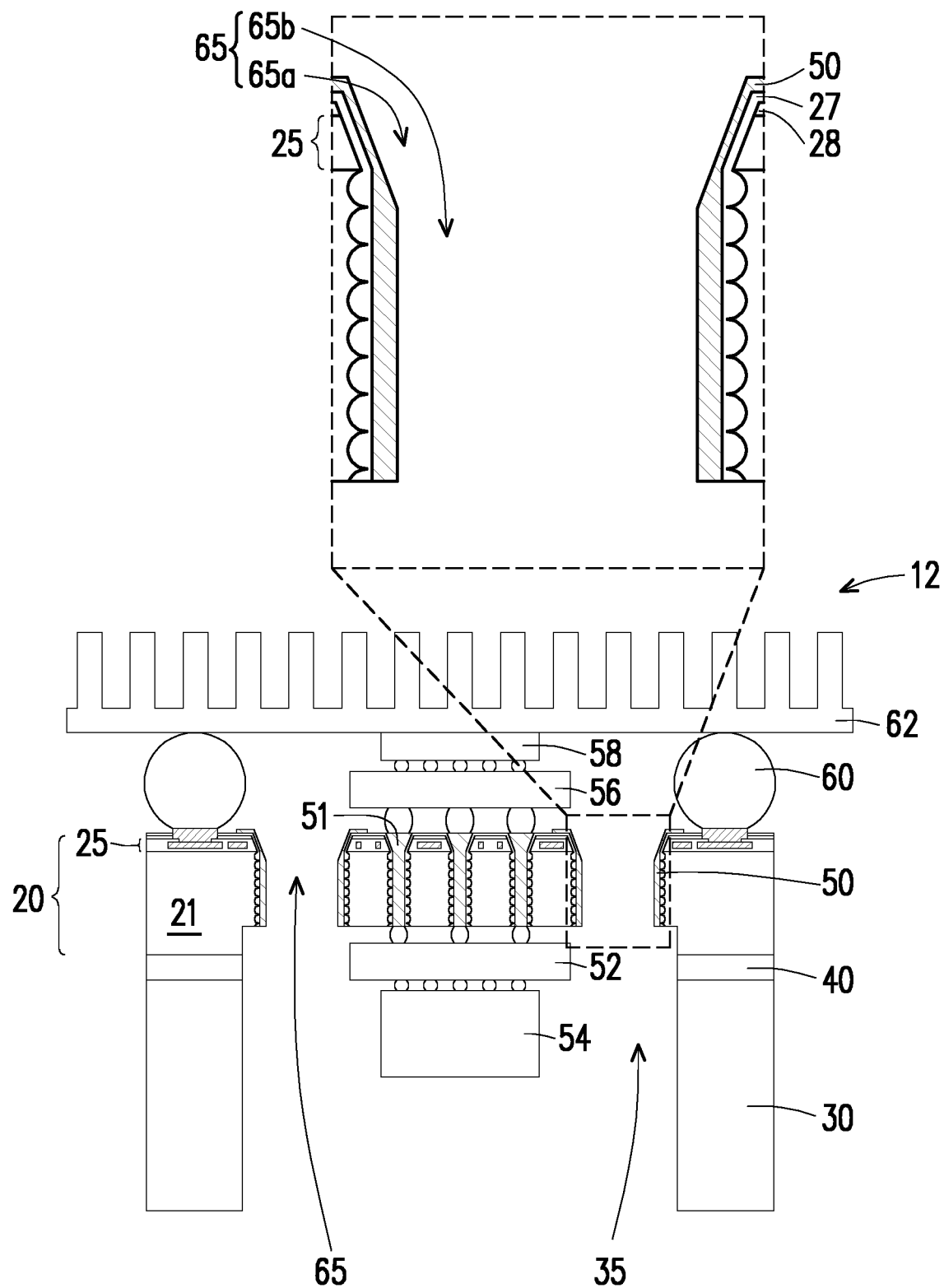
FIG. 13 is a cross-sectional view of a semiconductor device according to some embodiments of the present disclosure.

Referring to FIG. 13, in the semiconductor device 12, the central through substrate vias are filled with conductive materials 51, while the periphery through substrate vias remain open and serve as heat dissipation elements. One ends of the central through substrate vias of the circuit substrate 20 are electrically connected to a first integrated circuit structure 52, and the opposite ends of the central through substrate vias of the circuit substrate 20 are electrically connected to a second integrated circuit structure 56. In some embodiments, each of the first and second integrated circuit structures 52 and 56 includes an interposer substrate, a printed circuit board substrate or the like. Besides, each of the first and second integrated circuit structures 52 and 56 may contain a device, or may be free of a device. In some embodiments, the first integrated circuit structure 52 is electrically connected to a first die structure 54, and the second integrated circuit structure 56 is electrically connected to a second die structure 58. In some embodiments, each of the first and second die structures 54 and 58 can be a single die or a die stack including multiple dies vertically stacked. For example, the first die structure 54 is a die cube including multiple memory chips vertically stacked, and the second die structure 58 is a CPU chip.

In some embodiments, a heat spreader 62 is disposed over the second die structure 58, so as to dissipate heat of the semiconductor device effectively. The heat spreader 62 can be a fin-type heat sink or a cold plate. The heat spreader 62 is adhered to the second die structure 58 directly, or through a thermal interface material (TIM). In some embodiments, bumps 60 are further included in the semiconductor device 12 between the heat spreader 62 and the device layer 25 of the circuit substrate 20, so as to provide electrical and/or heat dissipation function.

In some embodiments, the conductive layer 50 and the conductive materials 51 are formed in the same process step. Specifically, the central through substrate vias are designed to have a width less than the width of the periphery through substrate vias. By such configuration, during the cyclic deposition and etching process of forming the conductive layer 50, the conductive materials on opposite sidewalls of each of the central through substrate vias are merged to completely fill the central through substrate vias. However, the disclosure is not limited thereto. In other embodiments, when the conductive materials on opposite sidewalls of each of the central through substrate vias are not able to fill up the central through substrate vias, a plating process may be further performed to form another conductive layer to completely fill the central through substrate vias.

The conductive layer 50 in the periphery through substrate vias is disposed not only on the sidewalls of the periphery through substrate vias, but also on a portion of the surface of the circuit substrate 20, so as to improve the heat dissipation performance. Besides, the through substrate vias shown in FIG. 3 to FIG. 6 can replace the periphery through substrate vias of the semiconductor structure 12 in FIG. 13 upon the design requirements.

The various embodiments or examples described herein offer several advantages over the existing art, as set forth above. It will be understood that not all advantages have been discussed herein, no particular advantage is required for all embodiments or examples, and other embodiments or examples may offer different advantages.

In accordance with one aspect of the present disclosure, a semiconductor device includes a substrate, at least one via, a liner layer and a conductive layer. The substrate includes an electronic circuitry. The at least one via passes through the substrate. The at least one via includes a plurality of concave portions on a sidewall thereof. The liner layer fills in the plurality of concave portions of the at least one via. The conductive layer is disposed on the sidewall of the at least one via, covers the liner layer, and extends onto a surface of the substrate. The thickness of the conductive layer on the sidewall of the at least one via is varied.

In accordance with another aspect of the present disclosure, a semiconductor device includes a circuit substrate, a passivation layer, at least one through substrate via, a conductive layer and an insulating liner. The circuit substrate includes a semiconductor substrate and a device layer over the semiconductor substrate. The passivation layer is disposed over the device layer. The at least one through substrate via passes through passivation layer, the device layer and the semiconductor substrate. The conductive layer covers the passivation layer and an inner sidewall of the at least one through substrate via. The insulating liner is disposed between the conductive layer and the semiconductor substrate of the circuit substrate, and the insulating liner has a scallop-like sidewall facing the semiconductor substrate and a substantially smooth sidewall facing the conductive layer.

In accordance with another aspect of the present disclosure, a method of forming a semiconductor device includes forming a device layer over a front side of a first substrate; forming at least one via, the at least one via penetrating through the device layer and extending into the first substrate; performing a cyclic deposition and etching process to form a conductive layer on a sidewall of the at least one via; and thinning a back side of the first substrate.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
   providing a substrate;
   forming at least one via penetrating through the substrate, wherein the at least one via comprises a plurality of concave portions on a sidewall thereof;
   forming a liner layer filling in the plurality of concave portions of the at least one via; and
   performing a cyclic deposition and etching process to form a conductive layer on the sidewall of the at least one via, covering the liner layer, and extending onto a surface of the substrate, wherein a thickness of the conductive layer on the sidewall of the at least one via is varied.

2. The method of claim 1, wherein the at least one via has a lower opening and an upper opening wider than the lower opening.

3. The method of claim 2, wherein the upper opening has a tilted and smooth sidewall, and the plurality of concave portions are arranged along the sidewall of the lower opening.

4. The method of claim 2, wherein the thickness of the conductive layer on the sidewall of the upper opening is less than the thickness of the conductive layer on the sidewall of the lower opening of the at least one via.

5. The method of claim 4, wherein the thickness of the conductive layer on the sidewall of the upper opening is equal to or less than a thickness of the conductive layer on the surface of the substrate.

6. The method of claim 1, further comprising filling the at least one via with a sacrificial insulating layer.

7. The method of claim 1, further comprising:
   providing a support substrate, the support substrate having at least one recess; and
   bonding the support substrate to the substrate, wherein the at least one via is in spatial communication with the at least one recess of the support substrate.

8. The method of claim 7, further comprising forming a bonding layer between the substrate and the support substrate.

9. The method of claim 1, wherein the conductive layer comprises one or more layers of Au, Ti, Ni, Ag and Cu or an alloy thereof.

10. A method of forming a semiconductor device, comprising:
    forming a device layer over a semiconductor substrate;
    forming a passivation layer over the device layer;
    forming at least one through substrate via penetrating through the passivation layer, the device layer and the semiconductor substrate; and
    performing a cyclic deposition and etching process to form a conductive layer covering the passivation layer and an inner sidewall of the at least one through substrate via, wherein the thickness of the conductive layer on a sidewall of an upper opening of the at least one via is less than the thickness of the conductive layer on a sidewall of a lower opening of the at least one via.

11. The method of claim 10, further comprising an insulating liner between the conductive layer and the semiconductor substrate, wherein the insulating liner has a scallop-like sidewall facing the semiconductor substrate and a substantially smooth sidewall facing the conductive layer.

12. The method of claim 11, wherein the scallop-like sidewall of the insulating liner comprises a plurality of concave portions, and widths of the concave portions are not uniform.

13. The method of claim 10, wherein an included angle between an upper opening of the inner sidewall of the at least one through substrate via and a bottom surface of the device layer is less than about 90 degrees.

14. The method of claim 10, further comprising:
  providing a support substrate, the support substrate having at least one recess; and
  bonding the support substrate to the semiconductor substrate, wherein the at least one via is in spatial communication with the at least one recess of the support substrate.

15. A method of forming a semiconductor device, comprising:
  forming a device layer over a front side of a first substrate;
  forming at least one via, the at least one via penetrating through the device layer and extending into the first substrate and having scallop portions on a sidewall thereof;
  performing a cyclic deposition and etching process to form a conductive layer on a sidewall of the at least one via; and
  thinning a back side of the first substrate.

16. The method of claim 15, further comprising forming a liner layer on the sidewall of the at least one via before forming the conductive layer, wherein the liner layer fills in the scallop portions of the at least one via adjacent to the first substrate.

17. The method of claim 15, further comprising:
  filling the at least one via with a filling material before the thinning; and
  forming at least one through substrate via by removing the filling material after the thinning.

18. The method of claim 15, further comprising:
  filling the at least one via with a filling material before the thinning;
  bonding a second substrate to the back side of the first substrate with a bonding layer interposed therebetween after the thinning;
  forming a recess in the second substrate so that a bottom of the at least one via is exposed; and
  forming at least one through substrate via by removing the filling material.

19. The method of claim 15, wherein the at least one via is formed to have a scallop-like sidewall in the first substrate.

20. The method of claim 15, wherein the cyclic deposition and etching process comprises m cycles of deposition and etching steps, and m is an integer from 2 to 5.

* * * * *